US009826179B2

(12) United States Patent
Shima

(10) Patent No.: US 9,826,179 B2
(45) Date of Patent: Nov. 21, 2017

(54) IMAGE READING APPARATUS AND SEMICONDUCTOR DEVICE

(71) Applicant: SEIKO EPSON CORPORATION, Tokyo (JP)

(72) Inventor: Shunichi Shima, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/418,926

(22) Filed: Jan. 30, 2017

(65) Prior Publication Data

US 2017/0251152 A1 Aug. 31, 2017

(30) Foreign Application Priority Data

Feb. 26, 2016 (JP) ................................. 2016-035534

(51) Int. Cl.
*H04N 1/04* (2006.01)
*H04N 5/357* (2011.01)
(Continued)

(52) U.S. Cl.
CPC ......... *H04N 5/3575* (2013.01); *H04N 1/0308* (2013.01); *H04N 1/193* (2013.01);
(Continued)

(58) Field of Classification Search
CPC ........... H04N 5/23241; H04N 5/23245; H04N 5/335; H04N 5/343; H04N 5/3698; H04N 5/378
USPC ........ 358/474, 445, 482, 483, 497; 382/312; 348/220.1, E5.024, 294
See application file for complete search history.

(56) References Cited

U.S. PATENT DOCUMENTS

| | | | | |
|---|---|---|---|---|
| 4,719,512 A | * | 1/1988 | Endo .................... | H04N 5/2173 348/250 |
| 6,184,513 B1 | * | 2/2001 | Sawada ............. | H01L 27/14643 250/208.1 |

(Continued)

FOREIGN PATENT DOCUMENTS

| | | |
|---|---|---|
| EP | 2144433 A2 | 1/2010 |
| JP | 2005-252529 A | 9/2005 |
| WO | 2007/135161 A1 | 11/2007 |

OTHER PUBLICATIONS

Tower et al.; "Shortwave Infrared 512 x 2 Line Sensor for Earth Resources Applications"; IEEE Transactions on Electron Devices, vol. ED-32, No. 8, Aug. 1985; pp. 1574-1583.

(Continued)

*Primary Examiner* — Negussie Worku
(74) *Attorney, Agent, or Firm* — Global IP Counselors, LLP

(57) ABSTRACT

An image reading apparatus includes an image reading chip configured to read an image. The image reading chip includes a first pixel unit which generates a first pixel signal, a second pixel unit which generates a second pixel signal, a first amplification unit which amplifies the first pixel signal, and outputs a first amplification signal, a second amplification unit which amplifies the second pixel signal, and outputs a second amplification signal, and a third amplification unit that amplifies each of the first amplification signal and the second amplification signal, and outputs an amplified signal. The image reading chip has a shape which includes a first side and a second side shorter than the first side. The third amplification unit is disposed between the first amplification unit and the second amplification unit in a direction along the first side.

12 Claims, 14 Drawing Sheets

(51) Int. Cl.
  *H04N 1/03* (2006.01)
  *H04N 1/193* (2006.01)
  *H04N 5/345* (2011.01)
  *H04N 5/355* (2011.01)
  *H04N 5/3745* (2011.01)
  *H01L 27/146* (2006.01)

(52) U.S. Cl.
  CPC ........... *H04N 5/3452* (2013.01); *H04N 5/355* (2013.01); *H04N 5/37457* (2013.01); *H01L 27/14612* (2013.01); *H01L 27/14643* (2013.01); *H04N 2201/0081* (2013.01); *H04N 2201/0082* (2013.01)

(56) References Cited

U.S. PATENT DOCUMENTS

| | | | |
|---|---|---|---|
| 7,141,775 B2 | 11/2006 | Koseki | |
| 7,394,055 B2 | 7/2008 | Koseki | |
| 7,432,493 B2 | 10/2008 | Koseki | |
| 7,589,304 B2 | 9/2009 | Koseki | |
| 7,601,939 B2 | 10/2009 | Koseki | |
| 2008/0273093 A1* | 11/2008 | Okita | H04N 5/23245 348/220.1 |
| 2016/0049432 A1* | 2/2016 | Otaka | H01L 27/14614 348/308 |
| 2016/0167366 A1* | 6/2016 | Shima | B41J 2/04541 347/10 |
| 2016/0214377 A1* | 7/2016 | Shima | B41J 2/04541 |
| 2017/0087831 A1* | 3/2017 | Shima | B41J 2/04586 |

OTHER PUBLICATIONS

The Extended European Search Report for the corresponding European Patent Application No. 17155319.1 dated Aug. 18, 2017.

* cited by examiner

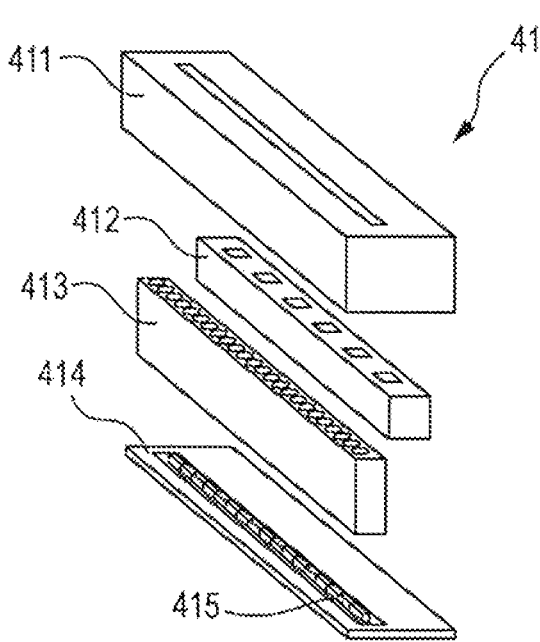
FIG. 3
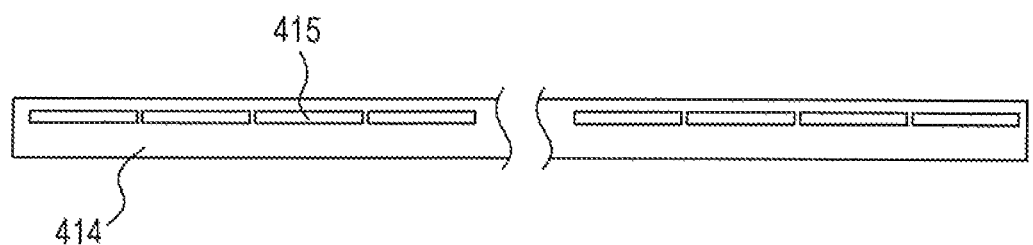
FIG. 4
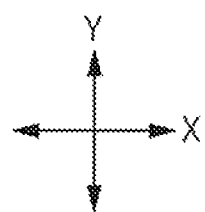

IMAGE READING APPARATUS AND SEMICONDUCTOR DEVICE

The entire disclosure of Japanese Patent Application No. 2016-035534, filed Feb. 26, 2016 is expressly incorporated by reference herein.

BACKGROUND

1. Technical Field

The present invention relates to an image reading apparatus and a semiconductor device.

2. Related Art

A complementary MOS (CMOS) process has high convenience because of being allowed to form a logical circuit and an analog circuit on the same IC chip. Thus, recently, various technologies relating to the CMOS process have been developed. An imaging sensor is no exception. An imaging sensor by the CMOS process (CMOS imaging sensor) instead of a CCD imaging sensor has been actively developed.

In the related art, as a circuit configuration of a CMOS imaging sensor, a column output circuit (referred to as a column processing unit below) is known. In the column output circuit, a signal is read from a photoelectric conversion unit (pixel unit) including a light receiving element, in a column direction. According to this configuration, parallel processing by a plurality of column processing units which form a pair for each light receiving element can be possible. Thus, it is possible to lower a data rate of each of the column processing units, and to reduce a noise level. Further, each of the column processing units includes a correlated double sampling (CDS) circuit, and thus it is possible to cancel a noise generated in the photoelectric conversion unit (pixel unit). Output magnification of a signal to be read may be also arbitrarily set depending on a ratio of capacitance of the CDS circuit and feedback capacitance. As the column processing unit, a source-grounded type amplifier is employed in many cases. This is because an amplifier is required for each column processing unit and thus a source-grounded type amplifier which may be mounted with an area smaller than that of a differential amplifier is more appropriate for reducing the size, than the differential amplifier.

The source-grounded type amplifier has a problem in that a power supply rejection ratio (PSRR) which is a ratio of the increased or decreased amount of an input offset voltage to fluctuation of a power source voltage is worse than that in the differential amplifier. Considering this circumstance, for example, a technology (solid state imaging device) for solving this problem is proposed in JP-A-2005-252529. In detail, a current value of an amplifier in a column processing unit is set to be constant, levels of a power source and the ground are maintained to be normally constant, and thus it is possible to improve the PSRR. According to the descriptions (for example, paragraph [0005], FIG. 4, and the like) of JP-A-2005-252529, it is supposed that output voltage characteristics are substantially proportional to illumination.

However, in the solid state imaging device of the related art, which is described in JP-A-2005-252529, there is a problem in that removing an offset voltage due to a source-grounded type amplifier of a column processing unit is difficult, and thus a dynamic range becomes narrower, and reading an image with high accuracy is not possible.

SUMMARY

An advantage of some aspects of the invention is to provide an image reading apparatus in which an image can be read with high accuracy. Another advantage of some aspects of the invention is to provide a semiconductor device which can output an image signal having a wide dynamic range.

The invention can be realized in the following aspects or application examples.

Application Example 1

According to this application example, there is provided an image reading apparatus which includes an image reading chip configured to read an image. The image reading chip includes a first pixel unit that includes a first light receiving element configured to receive light from the image and perform photoelectric conversion, and generates a first pixel signal, a second pixel unit that includes a second light receiving element configured to receive light from the image and perform photoelectric conversion, and generates a second pixel signal, a first amplification unit that is electrically connected to the first pixel unit, amplifies the first pixel signal, and outputs a first amplification signal, a second amplification unit that is electrically connected to the second pixel unit, amplifies the second pixel signal, and outputs a second amplification signal, and a third amplification unit that amplifies each of the first amplification signal and the second amplification signal, and outputs an amplified signal. The image reading chip has a shape which includes a first side and a second side shorter than the first side. The third amplification unit is disposed between the first amplification unit and the second amplification unit in a direction along the first side.

In the image reading apparatus according to the application example, the third amplification unit is disposed between the first amplification unit and the second amplification unit in the direction along the first side. Thus, it is possible to cause a manufacturing error of the first amplification unit, a manufacturing error of the second amplification unit, and a manufacturing error of the third amplification unit to be substantially equal to each other. Thus, it is possible to set an offset voltage of the first amplification unit, an offset voltage of the second amplification unit, and an offset voltage of the third amplification unit to be substantially equal, and to reduce a component of the offset voltage included in an output signal of the third amplification unit. As a result, according to the image reading apparatus of this application example, it is possible to widen a dynamic range of an output signal of an image reading chip, and to read an image with high accuracy.

Application Example 2

In the image reading apparatus according to the application example, the third amplification unit may be provided at a position of overlapping at least one of the first pixel unit and the second pixel unit in a direction along the second side.

In the image reading apparatus according to this application example, a pitch between a plurality of pixel units including the first pixel unit and the second pixel unit is determined by the maximum resolution for reading an image. At least one of the first amplification unit, the first pixel unit, the second amplification unit, and the second pixel unit is disposed so as to be shifted from a straight line in the direction along the second side. Because the third amplification unit is disposed in an empty space between the first amplification unit and the second amplification unit, it is possible to reduce an unnecessary space, and to reduce a chip size of an image reading chip.

Application Example 3

In the image reading apparatus according to the application example, the sum of the length of the first pixel unit and the length of the second pixel unit in the direction along the first side may be larger than the sum of the length of the first amplification unit and the length of the second amplification unit.

In the image reading apparatus according to this application example, a pitch between a plurality of pixel units including the first pixel unit and the second pixel unit is determined by the maximum resolution for reading an image. Since the sum of the length of the first pixel unit and the length of the second pixel unit is larger than the sum of the length of the first amplification unit and the length of the second amplification unit, providing a space for disposing the third amplification unit between the first amplification unit and the second amplification unit is possible. Thus, according to the image reading apparatus of this application example, it is possible to reduce an unnecessary space, and to reduce a chip size of an image reading chip.

Application Example 4

In the image reading apparatus according to the application example, the first amplification unit, the second amplification unit, and the third amplification unit may be electrically connected to a common ground wiring.

According to the image reading apparatus of this application example, it is possible to accurately adjust a ground potential between the first amplification unit, the second amplification unit, and the third amplification unit. Thus, it is possible to cause the offset voltage of the first amplification unit, the offset voltage of the second amplification unit, and the offset voltage of the third amplification unit to be more equal to each other. In addition, it is possible to more reduce the component of the offset voltage included in the output signal of the third amplification unit. As a result, according to the image reading apparatus of this application example, it is possible to more widen a dynamic range of an output signal of an image reading chip, and to read an image with high accuracy.

Application Example 5

In the image reading apparatus according to the application example, the first amplification unit and the third amplification unit may be disposed so as to be adjacent to each other, and the second amplification unit and the third amplification unit may be disposed so as to be adjacent to each other.

According to the image reading apparatus of this application example, since the first amplification unit and the third amplification unit have positions which are close to each other, it is possible to cause the manufacturing error of the first amplification unit, the manufacturing error of the second amplification unit, and the manufacturing error of the third amplification unit to be more equal to each other. Thus, it is possible to cause the offset voltage of the first amplification unit, the offset voltage of the second amplification unit, and the offset voltage of the third amplification unit to be more equal, and to more reduce the component of the offset voltage included in the output signal of the third amplification unit. As a result, according to the image reading apparatus of this application example, it is possible to more widen a dynamic range of an output signal of an image reading chip, and to read an image with high accuracy.

Application Example 6

In the image reading apparatus according to the application example, the first amplification unit may include a first transistor. The second amplification unit may include a second transistor. The third amplification unit may include a third transistor. The first transistor, the second transistor, and the third transistor may be provided at positions which overlap each other in the direction along the first side.

In the image reading apparatus according to this application example, the first transistor, the second transistor, and the third transistor are provided at the positions which overlap each other in the direction along the first side. Thus, it is possible to cause the manufacturing error of the first transistor, the manufacturing error of the second transistor, and the manufacturing error of the third transistor to be substantially equal to each other. Thus, it is possible to set the offset voltage of the first transistor, the offset voltage of the second transistor, and the offset voltage of the third transistor to be substantially equal, and to reduce the component of the offset voltage included in the output signal of the third amplification unit. As a result, according to the image reading apparatus of this application example, it is possible to widen a dynamic range of an output signal of an image reading chip, and to read an image with high accuracy.

Application Example 7

In the image reading apparatus according to the application example, the threshold voltage of the first transistor, the threshold voltage of the second transistor, and the threshold voltage of the third transistor may be substantially equal to each other.

"Being substantially equal" includes a case where at least one of the threshold voltage of the first transistor, the threshold voltage of the second transistor, and the threshold voltage of the third transistor is slightly shifted from a designed value due to accuracy, variation, and the like of processing in manufacturing, and thus a small difference between these threshold voltages may occur, in addition to a case where the threshold voltages thereof accurately coincide with each other.

According to the image reading apparatus of this application example, since the threshold voltage of the first transistor, the threshold voltage of the second transistor, and the threshold voltage of the third transistor are substantially equal to each other, it is possible to set the offset voltage of the first transistor, the offset voltage of the second transistor, and the offset voltage of the third transistor to be substantially equal to each other, and to reduce the component of the offset voltage included in the output signal of the third amplification unit. As a result, according to the image reading apparatus of this application example, it is possible to widen a dynamic range of an output signal of an image reading chip, and to read an image with high accuracy.

Application Example 8

In the image reading apparatus according to the application example, an overdrive voltage of the first transistor, an overdrive voltage of the second transistor, and an overdrive voltage of the third transistor may be substantially equal to each other.

"Being substantially equal" includes a case where at least one of the overdrive voltage of the first transistor, the overdrive voltage of the second transistor, and the overdrive voltage of the third transistor is slightly shifted from a designed value due to accuracy, variation, and the like of processing in manufacturing, and thus a small difference between these overdrive voltages may occur, in addition to a case where the overdrive voltages thereof accurately coincide with each other.

According to the image reading apparatus of this application example, since the overdrive voltage of the first transistor, the overdrive voltage of the second transistor, and the overdrive voltage of the third transistor are substantially equal to each other, it is possible to set the offset voltage of the first transistor, the offset voltage of the second transistor, and the offset voltage of the third transistor to be substantially equal to each other, and to reduce the component of the offset voltage included in the output signal of the third amplification unit. As a result, according to the image reading apparatus of this application example, it is possible to widen a dynamic range of an output signal of an image reading chip, and to read an image with high accuracy.

Application Example 9

In the image reading apparatus according to the application example, the first amplification unit may include a first source-grounded type amplifier in which a plurality of transistors including the first transistor is cascode-connected to each other. The second amplification unit may include a second source-grounded type amplifier in which a plurality of transistors including the second transistor is cascode-connected to each other. The third amplification unit may include a third source-grounded type amplifier in which a plurality of transistors including the third transistor is cascode-connected to each other. According to the image reading apparatus of this application example, all of the first amplification unit, the second amplification unit, and the third amplification unit are source-grounded type amplifiers in which a plurality of transistors is cascode-connected to each other. Thus, it is possible to increase an amplification factor of the first amplification unit, an amplification factor of the second amplification unit, and an amplification factor of the third amplification unit. Thus, according to the image reading apparatus of this application example, it is possible to increase a S/N ratio of an output signal of an image reading chip, and to read an image with high accuracy.

Application Example 10

In the image reading apparatus according to the application example, the third amplification unit may have characteristics in which an output voltage is lowered as illumination is increased.

According to the image reading apparatus of this application example, since the third amplification unit has characteristics in which an output voltage is lowered as illumination is increased, the output voltage of the third amplification unit has the maximum value when being dark (when illumination is 0), and is lowered as the illumination is increased. Thus, according to the image reading apparatus of this application example, the output signal of the image reading chip has a sufficiently high voltage in comparison to a noise level, during being dark. Accordingly, it is possible to improve signal accuracy during being dark, and to read an image with high accuracy.

Application Example 11

The image reading apparatus according to the application example may further include a fourth amplification unit that performs non-inverting amplification on an output signal from the third amplification unit, so as to generate an output signal of the image reading chip.

In the image reading apparatus according to this application example, a plurality of image signals including a first image signal and a second image signal is not input, but the output signal of the third amplification unit is input to the fourth amplification unit. Thus, according to the image reading apparatus of this application example, because input capacitance of the fourth amplification unit for generating the output signal of the image reading chip is reduced, it is possible to reduce degradation of the output signal in the image reading chip, and to read image with high accuracy.

Application Example 12

According to this application example, there is provided a semiconductor device which includes a first side and a second side shorter than the first side. The semiconductor device includes a first pixel unit that includes a first light receiving element configured to receive light and perform photoelectric conversion, and generates a first pixel signal, a second pixel unit that includes a second light receiving element configured to receive light and perform photoelectric conversion, and generates a second pixel signal, a first amplification unit that is electrically connected to the first pixel unit, amplifies the first pixel signal, and outputs a first amplification signal, a second amplification unit that is electrically connected to the second pixel unit, amplifies the second pixel signal, and outputs a second amplification signal, and a third amplification unit that amplifies each of the first amplification signal and the second amplification signal, and outputs an amplified signal. The third amplification unit is disposed between the first amplification unit and the second amplification unit in a direction along the first side.

In the semiconductor device according to this application example, the third amplification unit is disposed between the first amplification unit and the second amplification unit in the direction along the first side. Thus, it is possible to cause a manufacturing error of the first amplification unit, a manufacturing error of the second amplification unit, and a manufacturing error of the third amplification unit to be substantially equal to each other. Thus, it is possible to set an offset voltage of the first amplification unit, an offset voltage of the second amplification unit, and an offset voltage of the third amplification unit to be substantially equal, and to reduce a component of the offset voltage included in an output signal of the third amplification unit. As a result, according to the semiconductor device of this application example, it is possible to output an image signal having a wide dynamic range.

BRIEF DESCRIPTION OF THE DRAWINGS

The invention will be described with reference to the accompanying drawings, wherein like numbers reference like elements.

FIG. 3 is an exploded perspective view schematically illustrating a configuration of an image sensor module.

FIG. 4 is a plan view schematically illustrating a disposition of an image reading chip.

DESCRIPTION OF EXEMPLARY EMBODIMENTS

Hereinafter, a preferred exemplary embodiment according to the invention will be described in detail with reference to the drawings. The drawings are used to aid in the descriptions. The exemplary embodiment which will be described below does not unreasonably limit the details of aspects of the invention described in Claims. All components of a configuration which will be described below are not limited as necessary components for the aspect of the invention.

Hereinafter, a combination machine (combination device) 1 to which an image reading apparatus according to an aspect of the invention will be described in detail with reference to the accompanying drawings.

1. Structure of Combination Machine

Figure 1:
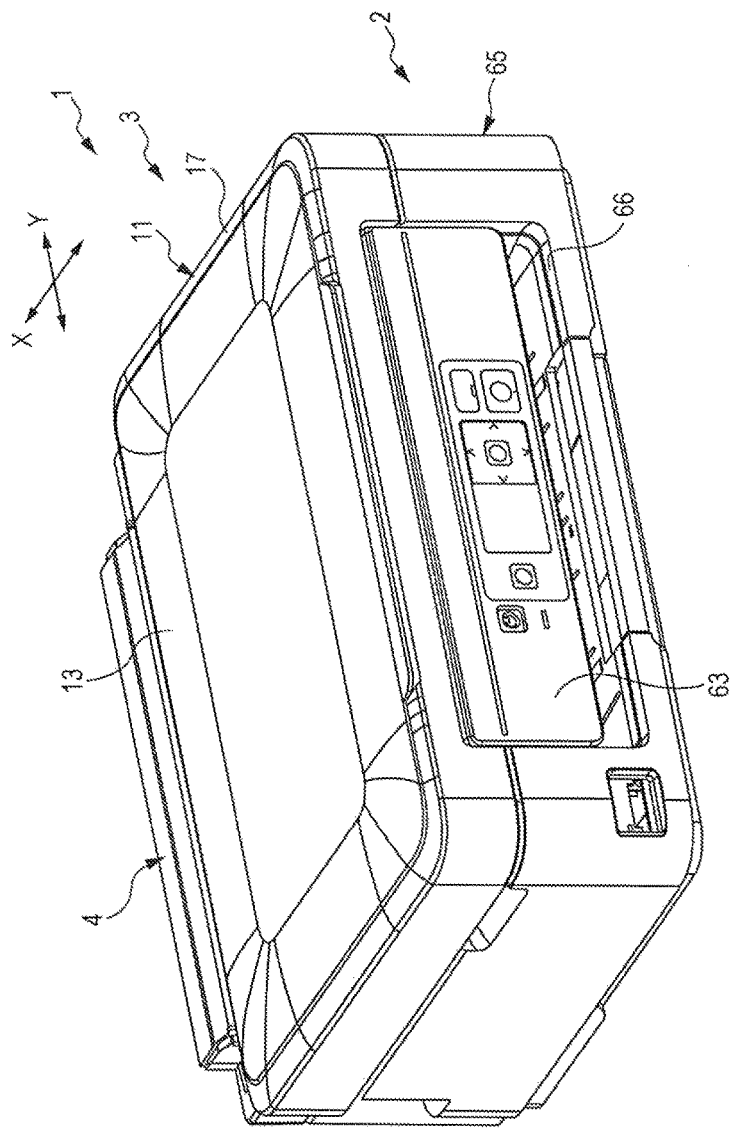
FIG. 1 is an external perspective view illustrating a combination machine according to an exemplary embodiment.

FIG. 1 is an external perspective view illustrating the combination machine 1. As illustrated in FIG. 1, the combination machine 1 integrally includes a printer unit (image recording device) 2 which corresponds to a device main body, and a scanner unit (image reading apparatus) 3. The scanner unit 3 corresponds to an upper unit which is disposed at an upper portion of the printer unit 2. Descriptions will be made on the assumption that a front-rear direction in FIG. 1 is an X axis direction and a crosswise direction is a Y axis direction.

As illustrated in FIG. 1, the printer unit 2 includes a transport unit (not illustrated), a print unit (not illustrated), an operation unit 63, a device frame (not illustrated), and a device housing 65. The transport unit sends a recording medium (print paper or cutform paper) corresponding to a sheet of paper, along a feeding path. The print unit is disposed over the feeding path, and performs ink jet printing on the recording medium. The operation unit 63 has a panel form, and is disposed on the front surface. The transport unit, the print unit, and the operation unit 63 are mounted in the device frame. The device housing 65 covers the above components. An exit port 66 through which a recording medium on which printing is ended exits is provided on the device housing 65. Although not illustrated, a USB port and a power port are disposed at a lower portion of the rear surface. That is, the combination machine 1 is configured so as to be allowed to be connected to a computer and the like via the USB port.

The scanner unit 3 is supported so as to be rotatable around the printer unit 2 through the hinge portion 4 at a rear end portion. The scanner unit 3 covers an upper portion of the printer unit 2 so as to be freely opened or closed. That is, the scanner unit 3 is raised in a rotational direction, thereby exposing the upper-surface opening portion of the printer unit 2, and the inside of the printer unit 2 is exposed through the opening portion on the upper-surface opening portion. The scanner unit 3 is lowered in the rotational direction, and is mounted on the printer unit 2, and thus the upper-surface opening portion is closed by the scanner unit 3. In this manner, the scanner unit 3 is opened, and thus exchange of an ink cartridge, solving paper jam, or the like can be performed.

Figure 2:
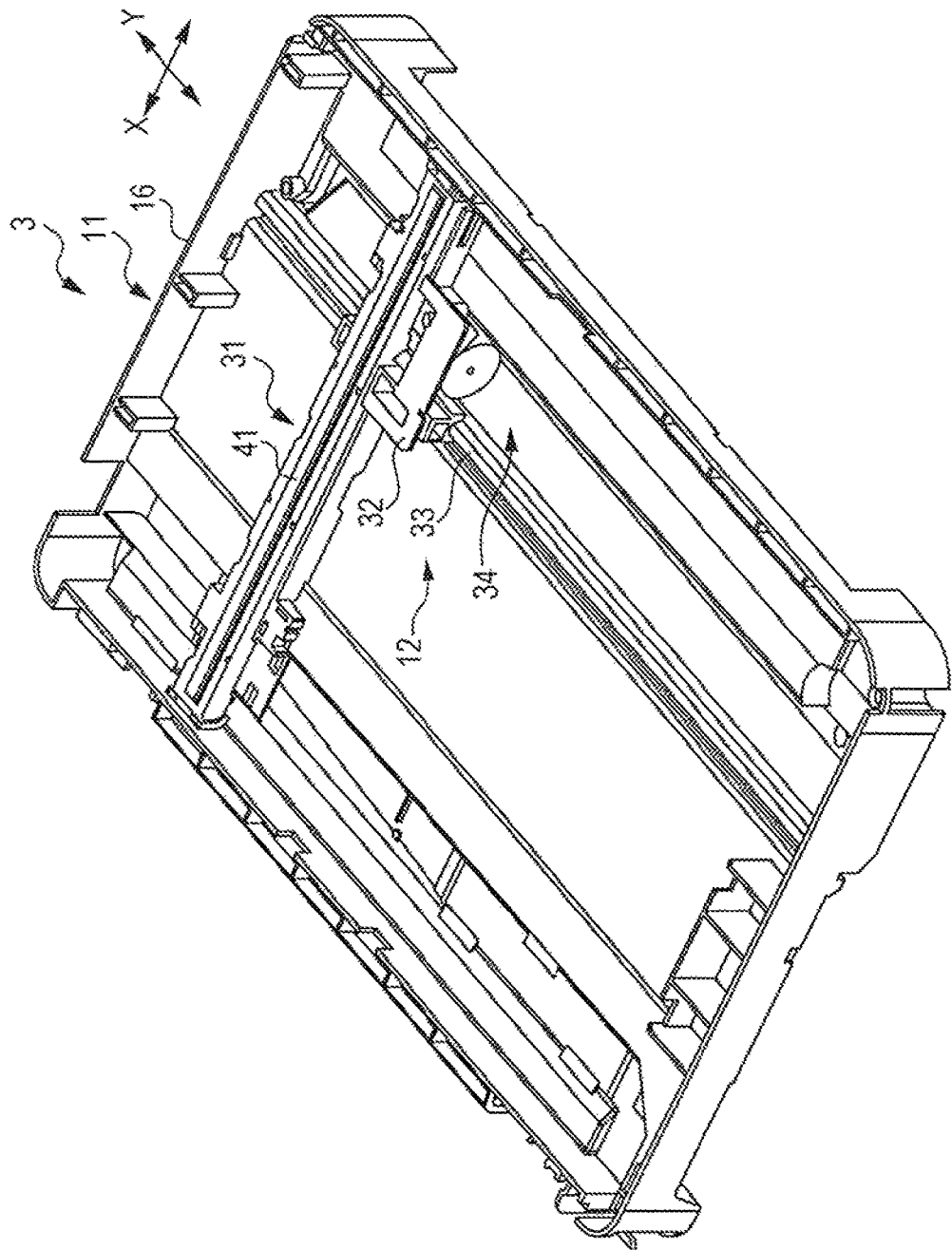
FIG. 2 is a perspective view illustrating an internal structure of a scanner unit.

FIG. 2 is a perspective view illustrating an internal structure of the scanner unit 3. As illustrated in FIGS. 1 and 2, the scanner unit 3 includes an upper frame 11 which is a housing, an image reading unit 12 accommodated in the upper frame 11, and an upper lid 13 supported by an upper portion of the upper frame 11. The upper lid 13 is supported so as to be rotatable. As illustrated in FIG. 2, the upper frame 11 includes a box type lower case 16 which accommodates the image reading unit 12, and an upper case 17 which covers the top surface of the lower case 16. A document mounting panel (document stand not illustrated) formed of glass is widely disposed on the upper case 17. A read medium (original document) of which a read surface is positioned downwardly is mounted on this document mounting panel. The lower case 16 is formed so as to have a shallow box shape of which an upper surface is opened.

As illustrated in FIG. 2, the image reading unit 12 includes a sensor unit 31 of a line sensor type, a sensor carriage 32 in which the sensor unit 31 is mounted, a guide shaft 33 which is extended in the Y axis direction, and slidably supports the sensor carriage 32, and a self-traveling sensor moving mechanism 34 which moves the sensor carriage 32 along the guide shaft 33. The sensor unit 31 includes an image sensor module 41 which is a complementary metal-oxide-semiconductor (CMOS) line sensor extended in the X axis direction. The sensor moving mechanism 34 is driven in the Y axis direction by a motor, and thus the sensor unit 31 performs reciprocation along the guide shaft 33. Thus, an image of the read medium (original document) on the document mounting panel is read. The sensor unit 31 may be a charge coupled device (CCD) line sensor.

FIG. 3 is an exploded perspective view schematically illustrating a configuration of the image sensor module 41. In the example illustrated in FIG. 3, the image sensor module 41 includes a case 411, a light source 412, a lens 413, a module substrate 414, and an image reading chip (semiconductor device) 415 for reading an image. The light source 412, the lens 413, and the image reading chip 415 are accommodated between the case 411 and the module substrate 414. A slit is provided in the case 411. The light source 412 includes, for example, light emitting diodes (LED) of R, G, and B. The light emitting diodes (LED) of R, G, and B (red LED, green LED, and blue LED) sequentially emit light while being rapidly switched. Light emitted by the light source 412 is applied to a read medium through the slit, and light from the read medium is input to the lens 413 through the slit. The lens 413 guides the input light to the image reading chip 415.

FIG. 4 is a schematic plan view illustrating a disposition of the image reading chip 415. As illustrated in FIG. 4, a plurality of image reading chips 415 is arranged on the module substrate 414 in parallel in an one-dimensional direction (X axis direction in FIG. 4). Each of the image reading chips 415 includes multiple light receiving elements which are disposed in a line. As the density of the light receiving elements provided in each of the image reading chip 415 increases, the scanner unit (image reading apparatus) 3 having a high resolution for reading an image can be realized. As the number of the image reading chips 415 increases, the scanner unit (image reading apparatus) 3 capable of also reading large images can be realized.

2. Functional Configuration of Scanner Unit (Image Reading Apparatus)

Figure 5:
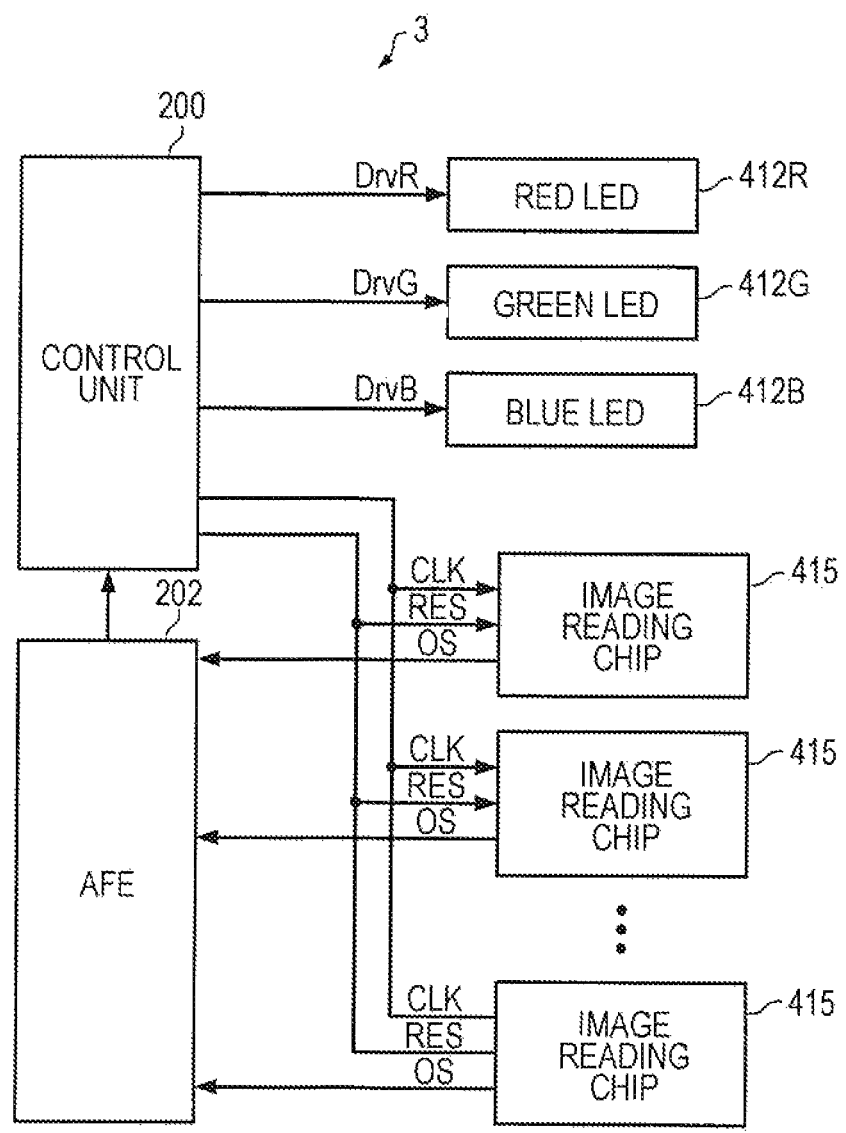
FIG. 5 is a diagram illustrating a functional configuration of the scanner unit.

FIG. 5 is a functional block diagram illustrating a functional configuration of the scanner unit (image reading apparatus) 3. In the example illustrated in FIG. 5, the scanner unit (image reading apparatus) 3 includes a control unit 200, an analog front end (AFE) 202, a red LED 412R, a green LED 412G, a blue LED 412B, and a plurality of image reading chips 415. As described above, the red LED 412R, the green LED 412G, and the blue LED 412B include the light source 412. The plurality of image reading chips 415 is disposed on the module substrate 414 in parallel. A plurality of red LEDs 412R, a plurality of green LEDs 412G, and a plurality of blue LEDs 412B may be provided. The control unit 200 and the analog front end (AFE) 202 are provided on the module substrate 414 or a substrate (not illustrated) which is different from the module substrate 414. Each of the control unit 200 and the analog front end (AFE) 202 may be realized by an integrated circuit (IC).

The control unit 200 supplies a drive signal DrvR to the red LED 412R at a predetermined timing, by a predetermined exposure time Δt, and thus causes the red LED 412R to emit light. Similarly, the control unit 200 supplies a drive signal DrvG to the green LED 412G at a predetermined timing, by the exposure time Δt, and thus causes the green LED 412G to emit light. The control unit 200 supplies a drive signal DrvB to the blue LED 412B at a predetermined timing, by the exposure time Δt, and thus causes the blue LED 412B to emit light. The control unit 200 causes the red LED 412R, the green LED 412G, and the blue LED 412B to emit light one by one.

The control unit 200 commonly supplies a clock signal CLK and a resolution setting signal RES to the plurality of the image reading chips 415. The clock signal CLK is an operation clock signal for the image reading chip 415. The resolution setting signal RES is a signal for setting a resolution at which the scanner unit (image reading apparatus) 3 reads an image. In the following descriptions, it is assumed that a resolution for reading an image by the scanner unit (image reading apparatus) 3 is set to be any one of 1200 dpi, 600 dpi, and 300 dpi in accordance with the resolution setting signal RES.

Each of the image reading chips 415 operates with synchronization with the clock signal CLK. The red LED 412R, the green LED 412G, or the blue LED 412B emits light, and thus each of the image reading chips 415 generates an image signal OS having image information of a resolution which is set by the resolution setting signal RES based on light which is received from an image formed in a read medium, by each of the light receiving elements. The image reading chip 415 outputs the generated image signal OS. A circuit configuration and an operation of the image reading chip 415 will be described later in detail.

The analog front end (AFE) 202 receives a plurality of image signals OS output by the image reading chips 415, and performs amplification or A/D conversion on each of the image signals OS. The analog front end (AFE) 202 converts each of the image signals OS into a digital signal which has a digital value depending on the intensity of the received light of each of the light receiving elements. The analog front end (AFE) 202 sequentially transmits digital signals to the control unit 200.

The control unit 200 receives the digital signals which are sequentially transmitted from the analog front end (APE) 202, and generates image information which has been read by the image sensor module 41.

3. Configuration and Operation of Image Reading Chip

Figure 6:
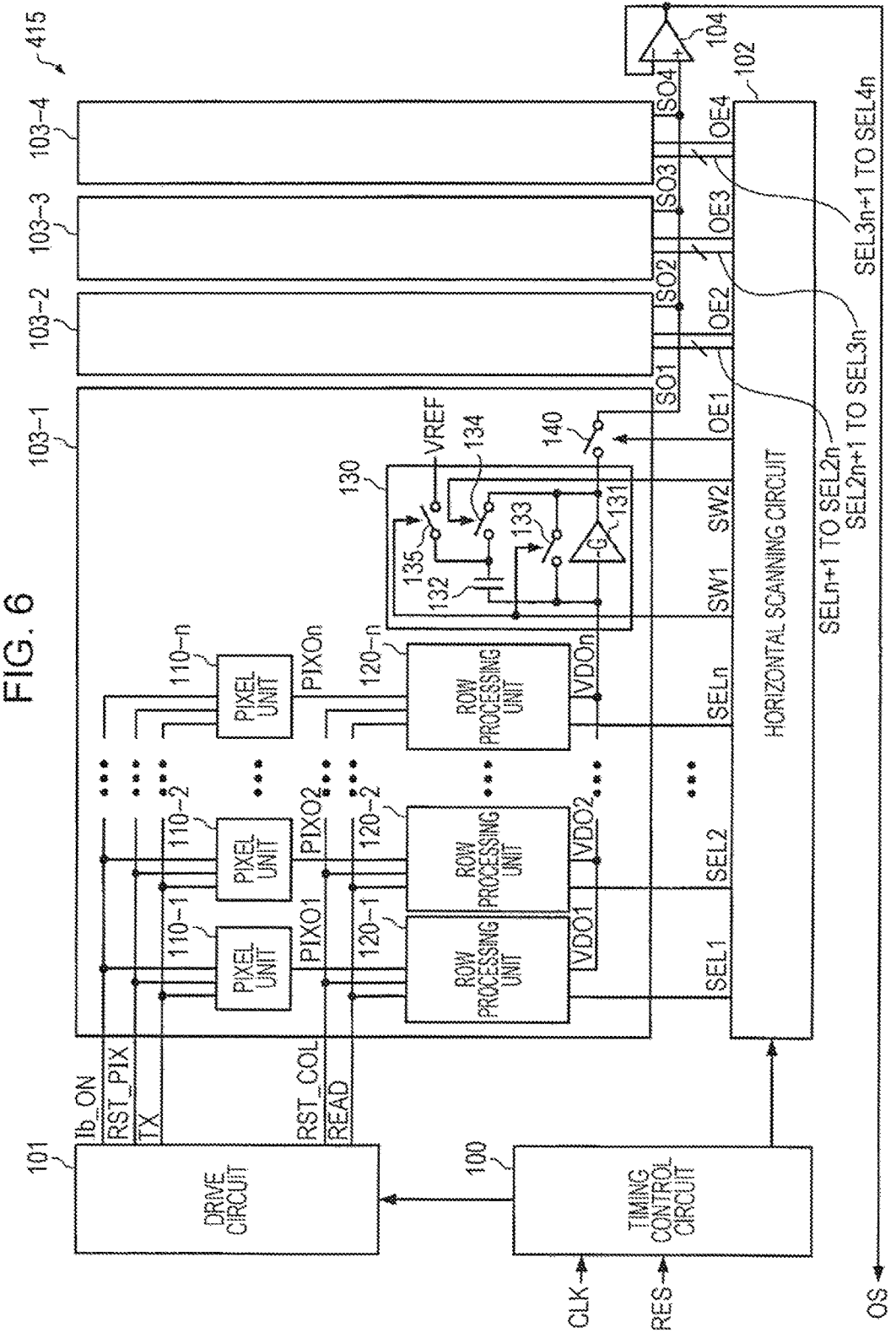
FIG. 6 is a diagram illustrating a circuit configuration of the image reading chip.
Figure 7:
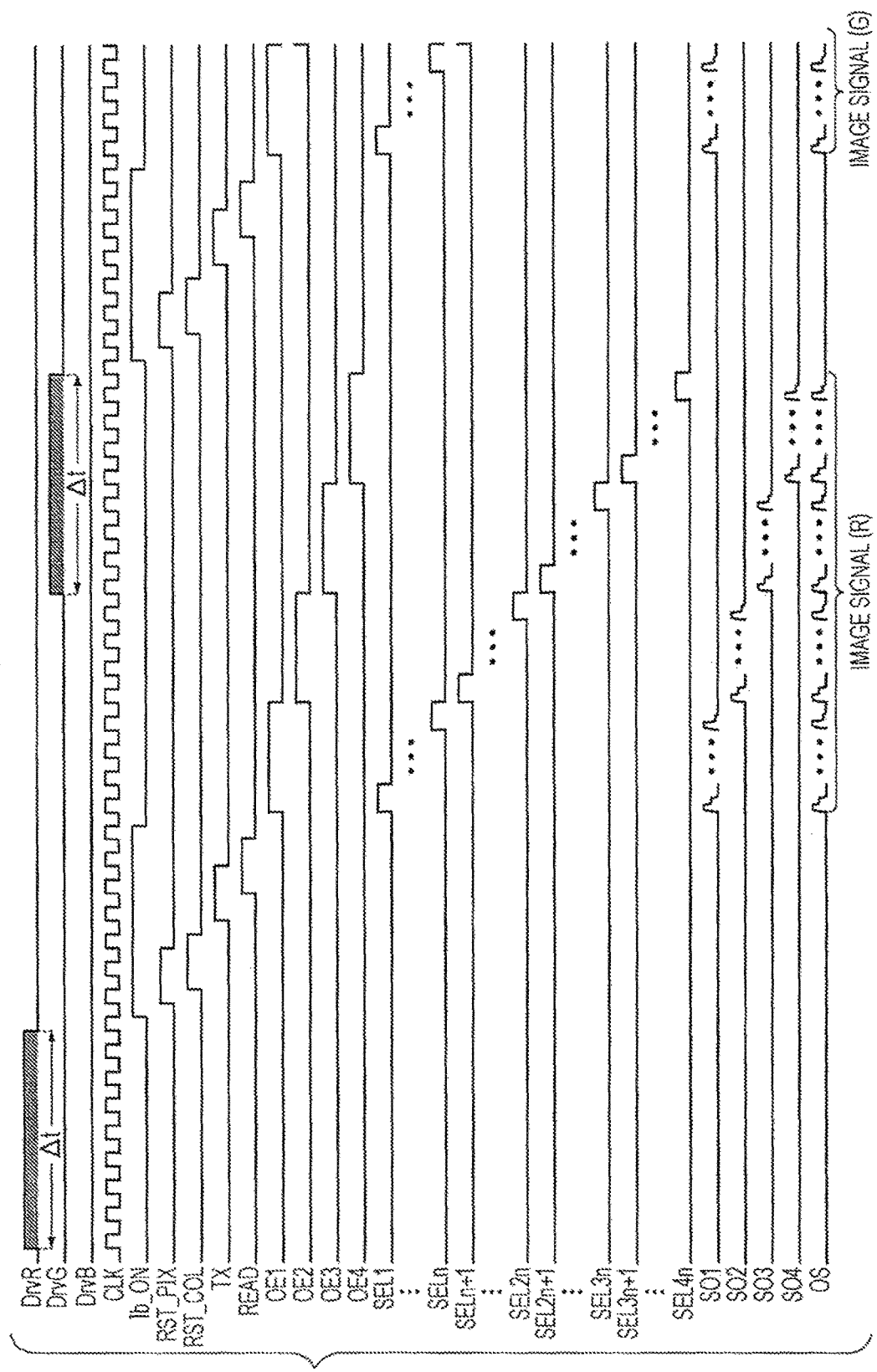
FIG. 7 is a timing chart illustrating a timing of a reading operation for an image by the image reading chip.

FIG. 6 is a diagram illustrating a circuit configuration of the image reading chip 415. FIG. 7 is a timing chart illustrating a timing of a reading operation for an image by the image reading chip 415. FIG. 7 is a timing chart in a case where a resolution at which the scanner unit (image reading apparatus) 3 reads an image is set to 1200 dpi.

The image reading chip 415 illustrated in FIG. 6 includes a timing control circuit 100, a drive circuit 101, a horizontal scanning circuit 102, four signal processing units 103 (103-1 to 103-4), and an operation amplifier 104. Each of the above circuits receives a power source potential VDD and a ground potential VSS which are supplied from external terminals of the image reading chip 415, so as to operate. In the exemplary embodiment, the circuits constituting the image reading chip 415 are integrally formed on a silicon substrate (illustration is omitted in FIG. 6) by a semiconductor process including a photolithographic method. That is, the image reading chip 415 is configured as one integrated circuit (IC) chip.

The timing control circuit 100 includes a counter (not illustrated) for counting a pulse of the clock signal CLK. The timing control circuit 100 generates a control signal for controlling an operation of the drive circuit 101, and a control signal for controlling an operation of the horizontal scanning circuit 102, based on an output value of the counter (counter value).

The drive circuit 101 generates a bias current ON signal Ib_ON which is synchronized with the clock signal CLK, and is active (high level in the exemplary embodiment) at a predetermined timing for a predetermined period, based on the control signal from the timing control circuit 100 (see FIG. 7). The bias current ON signal Ib_ON is commonly supplied to n pieces of pixel units 110 (110-1 to 110-*n*) which are provided in each of the four signal processing units 103 (103-1 to 103-4).

The drive circuit 101 generates a pixel reset signal RST_PIX and a column reset signal RST_COL which are synchronized with the clock signal CLK, and are active (high level in the exemplary embodiment) at a predetermined timing for a predetermined period, based on the control signal from the timing control circuit 100 (see FIG. 7). The pixel reset signal RST_PIX is commonly supplied to n pieces of the pixel units 110 (110-1 to 110-*n*) which are provided in each of the four signal processing units 103 (103-1 to 103-4). The column reset signal RST_COL is commonly supplied to n pieces of column processing units 120 (120-1 to 120-*n*) which are provided in each of the four signal processing units 103.

The drive circuit 101 generates a transfer signal TX and a reading signal READ which are synchronized with the clock signal CLK, and are active (high level in the exemplary embodiment) at a predetermined timing for a predetermined period, based on the control signal from the timing control circuit 100 (see FIG. 7). The transfer signal TX is commonly supplied to n pieces of the pixel units 110 (110-1 to 110-*n*) which are provided in each of the four signal processing units 103 (103-1 to 103-4). The reading signal READ is commonly supplied to n pieces of the column processing units 120 (120-1 to 120-*n*) which are provided in each of the four signal processing units 103 (103-1 to 103-4).

The horizontal scanning circuit 102 generates 4n pieces of selection signals SEL1 to SEL4*n* which are synchronized with the clock signal CLK, based on the control signal from the timing control circuit 100, and the resolution setting signal RES. When the resolution of 1200 dpi is set by the resolution setting signal RES, the horizontal scanning circuit 102 sequentially generates 4n pieces of selection signals SEL1 to SEL4*n* which are active (high level in the exemplary embodiment), one-by-one for each one duration of the clock signal (see FIG. 7). When the resolution of 600 dpi is set by the resolution setting signal RES, the horizontal scanning circuit 102 sequentially generates 4n pieces of selection signals SEL1 to SEL4*n* which are active (high level), by two signals corresponding to two durations of the clock signal. When the resolution of 300 dpi is set by the resolution setting signal RES, the horizontal scanning circuit 102 sequentially generates 4n pieces of selection signals SEL1 to SEL4*n* which are active (high level), by four signals corresponding to four durations of the clock signal.

n pieces of the selection signals SEL1 to SEL*n* are supplied to n pieces of column processing units 120-1 to 120-*n* provided in the signal processing unit 103-1, respectively. n pieces of the selection signals SEL*n*+1 to SEL2*n* are supplied to n pieces of column processing units 120-1 to 120-*n* provided in the signal processing unit 103-2, respectively. n pieces of the selection signals SEL2*n*+1 to SEL3*n* are supplied to n pieces of column processing units 120-1 to 120-*n* provided in the signal processing unit 103-3, respectively. n pieces of the selection signals SEL3*n*+1 to SEL4*n* are supplied to n pieces of column processing units 120-1 to 120-*n* provided in the signal processing unit 103-4, respectively.

The four signal processing units 103 (103-1 to 103-4) have the same configuration. Each of the signal processing units includes n pieces of pixel units 110 (110-1 to 110-*n*), n pieces of column processing units 120 (120-1 to 120-*n*), an amplification circuit 130, and a switch 140.

n pieces of pixel units 110 (110-1 to 110-*n*) outputs pixel signals PIXO1 to PIXO*n*, respectively. Each of the pixel signals has a voltage depending on light which has been received from a read medium by light emitting of the red LED 412R, the green LED 412G, or the blue LED 412B during an exposure time Δt.

n pieces of the column processing units 120 (120-1 to 120-*n*) amplifies the pixel signals PIXO1 to PIXO*n* output from n pieces of the pixel units 110 (110-1 to 110-*n*), respectively. When the reading signal READ is active (high level), the column processing unit stores the voltage of the amplified signal. When n pieces of selection signals SEL (selection signals SEL1 to SEL*n*, selection signals SEL*n*+1 to SEL2*n*, selection signals SEL2*n*+1 to SEL3*n*, or selection signals SEL3*n*+1 to SEL4*n*) which are supplied from the horizontal scanning circuit 102 are active (high level), n pieces of column processing units 120 (120-1 to 120-*n*) output image signals VDO1 to VDO*n* which depend on the stored voltage, to the amplification circuit 130.

When the resolution of 1200 dpi is set by the resolution setting signal RES, the voltage of the signal input to the amplification circuit 130 corresponds to the voltage of the image signal which is sequentially selected from n pieces of the image signals VDO1 to VDO*n* by the n pieces of selection signals SEL. When the resolution of 600 dpi is set by the resolution setting signal RES, the voltage of the signal input to the amplification circuit 130 corresponds to an average voltage of two image signals which are simultaneously selected from n pieces of the image signals VDO1 to VDO*n* by the n pieces of selection signals SEL. The selection is sequentially performed. When the resolution of 300 dpi is set by the resolution setting signal RES, the voltage of the signal input to the amplification circuit 130 corresponds to an average voltage of four image signals which are simultaneously selected from n pieces of the image signals VDO1 to VDO*n* by the n pieces of selection signals SEL. The selection is sequentially performed.

The amplification circuit 130 includes an operation amplifier 131, a capacitor 132, a switch 133, a switch 134, and a switch 135.

The operation amplifier 131 is, for example, a source-grounded type amplifier configured by a plurality of MOS transistors. The capacitor 132 is a capacitor for feedback of the operation amplifier 131. The switch 133 is a switch for feedback of the operation amplifier 131. The switch 134 is a switch for controlling a feedback signal of the operation amplifier 131. The switch 135 is a switch for controlling an external input signal of the operation amplifier 131.

One end of the switch 133 and one end of the capacitor 132 are connected to the input terminal of the operation amplifier 131. Another end of the capacitor 132 is connected to one end of the switch 134 and one end of the switch 135.

Another end of the switch 133 and another end of the switch 134 are connected to an output terminal of the operation amplifier 131. A reference voltage VREF which is an external input voltage is applied to another end of the switch 135. The reference voltage VREF is generated by, for example, a voltage generation unit (not illustrated in FIG. 6), or is supplied from the external terminal of the image reading chip 415.

A switch control signal SW1 is commonly input from the horizontal scanning circuit 102 to a control terminal of the switch 133 and a control terminal of the switch 135. The switch 133 and the switch 135 are conducted when the switch control signal SW1 is active (high level in the exemplary embodiment). A switch control signal SW2 is commonly input from the horizontal scanning circuit 102 to the control terminal of the switch 134. The switch 134 is conducted when the switch control signal SW2 is active (high level in the exemplary embodiment). The switch control signal SW1 and the switch control signal SW2 are active (high level) exclusively from each other.

Output enable signals OE1, OE2, OE3, and OE4 are input from the horizontal scanning circuit 102 to the control terminals of the switch 140 provided in the four signal processing units 103, respectively. Each of the switches 140 provided in the four signal processing units 103 is conducted when the corresponding one of the output enable signals OE1, OE2, OE3, and OE4 is active (high level in the exemplary embodiment).

The output enable signals OE1, OE2, OE3, and OE4 are signals of which any one is sequentially active (high level). The four signal processing units 103 sequentially output image signals SO1, SO2, SO3, and SO4 from the amplification circuit 130 through the switch 140 (see FIG. 7).

In the operation amplifier 104, the output terminals (another end of the switch 140) of the four signal processing unit 103 are commonly connected to the non-inverted input terminal, and the inverted input terminal and the output terminal are connected to each other. The operation amplifier 104 is a voltage follower, and the output voltage is equal to the voltage of the non-inverted input terminal. Thus, the output signal of the operation amplifier 104 is a signal which sequentially includes the output image signals SO1, SO2, SO3, and SO4. The output signal is output from the image reading chip 415, as the image signal OS (see FIG. 7).

Figure 8:
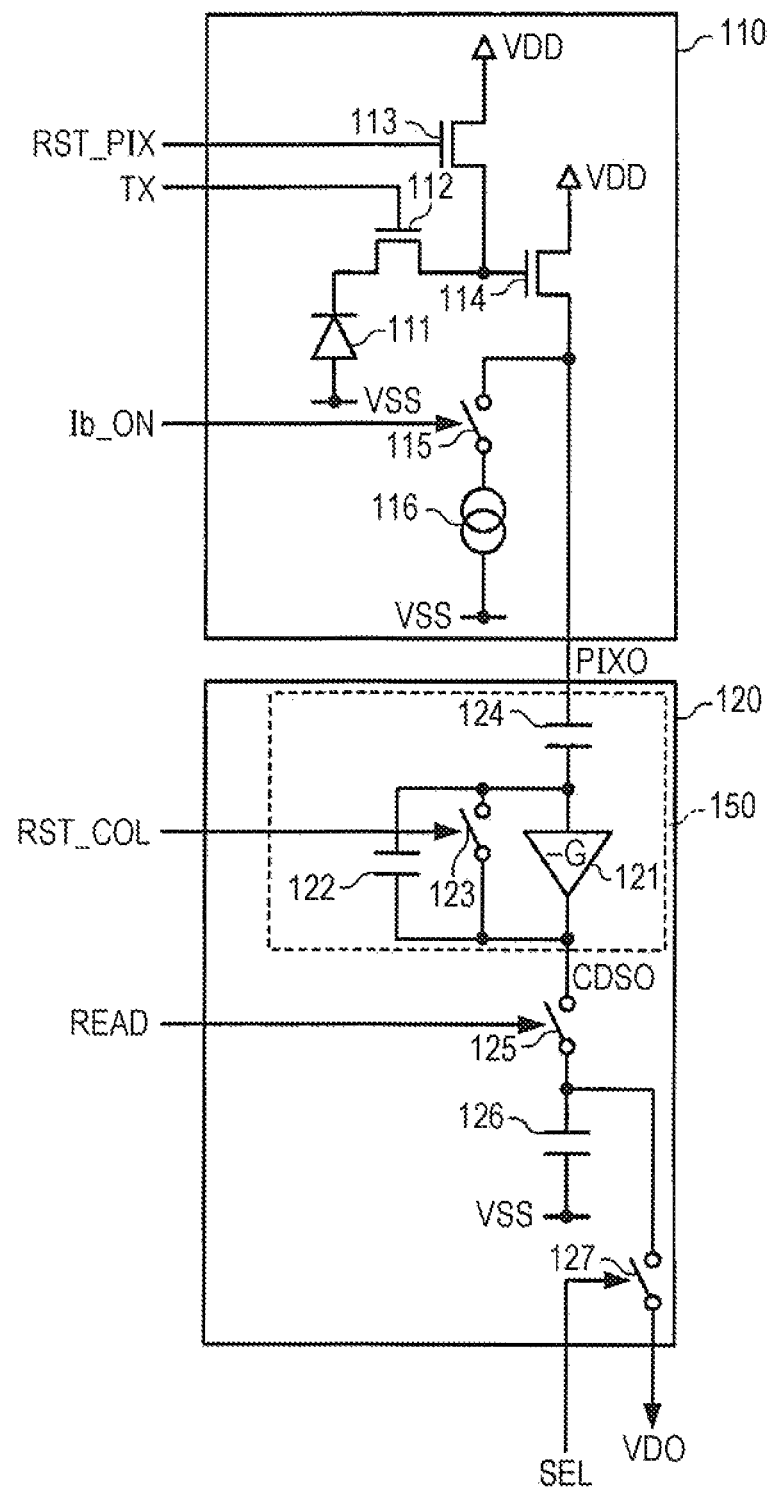
FIG. 8 is a diagram illustrating a configuration of a pixel unit and a column processing unit.

All of n pieces of the pixel units 110 (110-1 to 110-$n$) illustrated in FIG. 6 have the same configuration. Similarly, all of n pieces of the column processing units 120 (120-1 to 120-$n$) have the same configuration. FIG. 8 is a diagram illustrating a configuration of the pixel unit 110 and the column processing unit 120. As illustrated in FIG. 8, the pixel unit 110 includes a light receiving element 111, an NMOS transistor 112, an NMOS transistor 113, an NMOS transistor 114, a switch 115, and a constant current source 116.

The light receiving element 111 receives light (in the exemplary embodiment, light from an image formed on a read medium), and converts (photoelectrically-converts) the received light into an electric signal. In the exemplary embodiment, the light receiving element 111 is configured by a photodiode. The ground potential VSS is supplied to an anode of the photodiode, and a cathode thereof is connected to the source terminal of the NMOS transistor 112.

The transfer signal TX is input to the gate terminal of the NMOS transistor 112, and the drain terminal of the NMOS transistor 112 is connected to the gate terminal of the NMOS transistor 114.

A power source potential VDD is supplied to the drain terminal of the NMOS transistor 113. A pixel reset signal RST_PIX is input to the gate terminal of the NMOS transistor 113, and the source terminal thereof is connected to the gate terminal of the NMOS transistor 114.

The power source potential VDD is supplied to the drain terminal of the NMOS transistor 114. The source terminal of the NMOS transistor 114 is connected to one end of the switch 115.

Another end of the switch 115 is connected to one end of the constant current source 116. The ground potential VSS is supplied to another end of the constant current source 116. The bias current ON signal Ib_ON is input to the control terminal of the switch 115. The switch 115 is a switch having a function of controlling a load current for driving the NMOS transistor 114. When the bias current ON signal Ib_ON is active (high level), the switch 115 is conducted and thus the source terminal of the NMOS transistor 114 is electrically connected to the one end of the constant current source 116. A signal output from the source terminal of the NMOS transistor 114 is input to the column processing unit 120, as a pixel signal PIXO (any one of PIXO1 to PIXOn in FIG. 6).

The column processing unit 120 includes an operation amplifier 121, a capacitor 122, a switch 123, a capacitor 124, a switch 125, a capacitor 126, and a switch 127.

The capacitor 124 has one end which is connected to the source terminal of the NMOS transistor 114 (output terminal of the pixel unit 110), and the other end which is connected to the input terminal of the operation amplifier 121.

The operation amplifier 121 is, for example, a source-grounded type amplifier configured by a plurality of MOS transistors. The capacitor 122 is a capacitor for feedback of the operation amplifier 121. The switch 123 is a switch for feedback of the operation amplifier 121. One end of the capacitor 122 and one end of the switch 123 are connected to the input terminal of the operation amplifier 121. Another end of the capacitor 122 and another end of the switch 123 are connected to the output terminal of the operation amplifier 121.

The column reset signal RST_COL is input to the control terminal of the switch 123. The switch 123 is conducted when the column reset signal RST_COL is active (high level).

The operation amplifier 121, the capacitor 122, the switch 123, and the capacitor 124 constitute a correlated double sampling (CDS) circuit 150. The CDS circuit 150 has a function of performing noise cancelling on an output voltage Vpix from the pixel unit 110 by using the capacitor 124, and of amplifying a signal obtained by noise cancelling. The voltage of the output terminal of the operation amplifier 121 corresponds to an output voltage Vcds of the CDS circuit 150.

The output terminal of the operation amplifier 121 is connected to one end of the switch 125. Another end of the switch 125 is connected to one end of the capacitor 126. The ground potential VSS is supplied to another end of the capacitor 126, and a reading signal READ is input to the control terminal of the switch 125. The switch 125 is conducted when the reading signal READ is active (high level), and thus the output terminal of the operation amplifier 121 is electrically connected to the one end of the capacitor 126. Thus, charges depending on a potential difference between an output signal CDSO of the CDS circuit 150 and the ground potential VSS are accumulated in the capacitor 126.

The one end of the capacitor 126 is also connected to one end of the switch 127. Another end of the switch 127 is connected to the operation amplifier 131 (input terminal of the amplification circuit 130) (see FIG. 6). The selection signal SEL (any of SEL1 to SEL4$n$ in FIG. 6) is input to the control terminal of the switch 127. The switch 127 is a column-selection switch. The switch 127 is conducted when the selection signal SEL is active (high level), and thus the one end of the capacitor 126 is electrically connected to the input terminal of the operation amplifier 131 (input terminal of the amplification circuit 130). A signal at the one end of the capacitor 126 (signal having a voltage which depends on charges accumulated in the capacitor 126) is input to the amplification circuit 130, as an image signal VDO (any of VDO1 to VDOn in FIG. 6).

Figure 9:
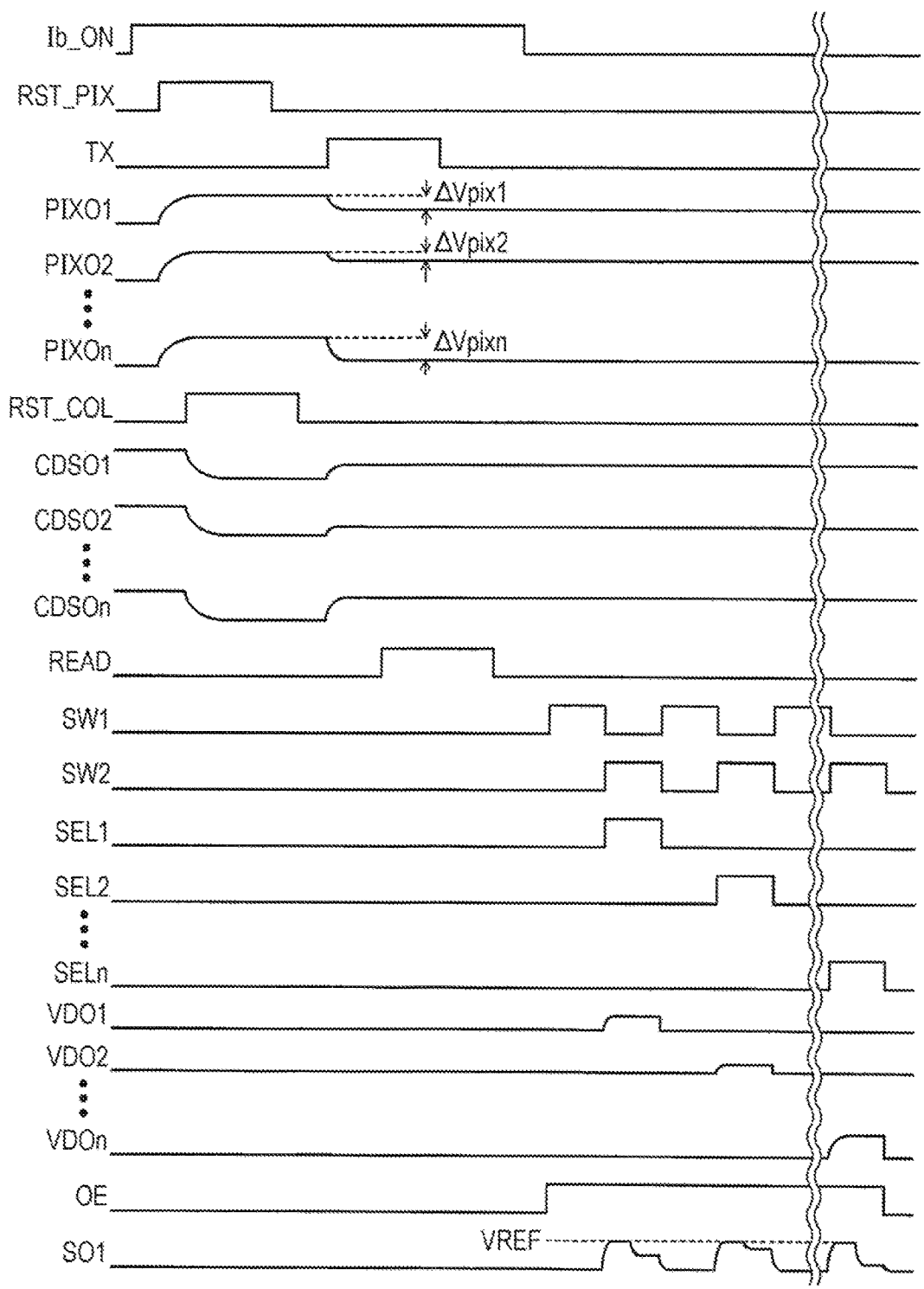
FIG. 9 is a timing chart illustrating a timing of an operation of a signal processing unit.

FIG. 9 is a timing chart illustrating a timing of an operation of the signal processing unit 103-1 illustrated in FIG. 6. FIG. 9 is a timing chart in a case where the resolution is set to 1200 dpi by the resolution setting signal RES. It is assumed that charges (negative charges) depending on intensity of received light are accumulated in the light receiving element 111 provided in each of n pieces of the pixel units 110 (110-1 to 110-n).

As illustrated in FIG. 9, firstly, the bias current ON signal Ib_ON becomes active (high level), and the switch 115 in each of n pieces of the pixel units 110 is conducted. In this state, if the pixel reset signal RST_PIX becomes active (high level), the source terminal and the drain terminal of the NMOS transistor 113 is conducted, and the power source potential VDD is supplied to the gate terminal of the NMOS transistor 114, in each of n pieces of pixel units 110. Thus, the source terminal and the drain terminal of the NMOS transistor 114 are conducted, and thus the voltages of the pixel signals PIXO1 to PIXOn which are respectively output from n pieces of pixel units 110 is increased up to the power source potential VDD. At this time, since the column reset signal RST_COL is active (high level), in each of n pieces of column processing units 120, the switch 123 is conducted, and charges accumulated in the capacitor 122 are reset. Thus, each of the output signals CDSO1 to CDSOn of n pieces of the CDS circuits 150 is lowered up to a predetermined voltage.

Then, after the pixel reset signal RST_PIX and the column reset signal RST_COL are inactive (low level), if the transfer signal TX becomes active (high level), in each of n pieces of pixel units 110, the source terminal and the drain terminal of the NMOS transistor 112 are conducted. The gate terminal of the NMOS transistor 114 has a voltage depending on charges accumulated in the light receiving element 111. Since the amount of charges (negative charges) accumulated in the light receiving element 111 is increased as intensity of received light of the light receiving element 111 becomes higher, the voltage of the gate terminal of the NMOS transistor 114 is lowered as the intensity of received light in the light receiving element 111 is increased. Thus, the voltages of the pixel signals PIXO1 to PIXOn are lowered by $\Delta$Vpix1 to $\Delta$Vpixn, respectively. At this time, since the switch 123 is not conducted, n pieces of CDS circuits 150 operate, and the output signals CDSO1 to CDSOn are increased in proportion to $\Delta$Vpix1 to $\Delta$Vpixn, respectively.

Then, after the voltages of the output signals CDSO1 to CDSOn of n pieces of the CDS circuits 150 are stabilized, if the reading signal READ is active (high level), the switch 125 is conducted. Thus, charges accumulated in n pieces of capacitors 126 vary depending on $\Delta$Vpix1 to $\Delta$Vpixn, respectively.

Then, after the bias current ON signal Ib_ON, the transfer signal TX, and the reading signal READ are inactive (low level), the output enable signal OE (any of OE1 to OE4 in FIG. 6) maintains to be active (high level) for a predetermined period. When the output enable signal OE is active (high level), a state where the switch control signal SW1 is active (high level), and the switch control signal SW2 is inactive (low level), and a state where the switch control signal SW1 is inactive (low level) and the switch control signal SW2 is active (high level) are alternately repeated. Every time the switch control signal SW1 is inactive (low level) and the switch control signal SW2 is active (high level), n pieces of the selection signals SEL1 to SELn sequentially become active (high level).

Every time n pieces of the selection signals SEL1 to SELn sequentially become active (high level), image signals VDO1 to VDOn which have a voltage depending on charges accumulated in the capacitor 126 are sequentially output from n pieces of the column processing units 120-1 to 120-n. The image signals VDO1 to VDOn are sequentially amplified by the amplification circuit 130, and thus an image signal SO1 is generated.

The timing chart illustrating a timing of operations of the signal processing units 103-2 to 103-4 illustrated in FIG. 6 is also similar to that in FIG. 9. Thus, illustrations and descriptions will be omitted.

Figure 10:
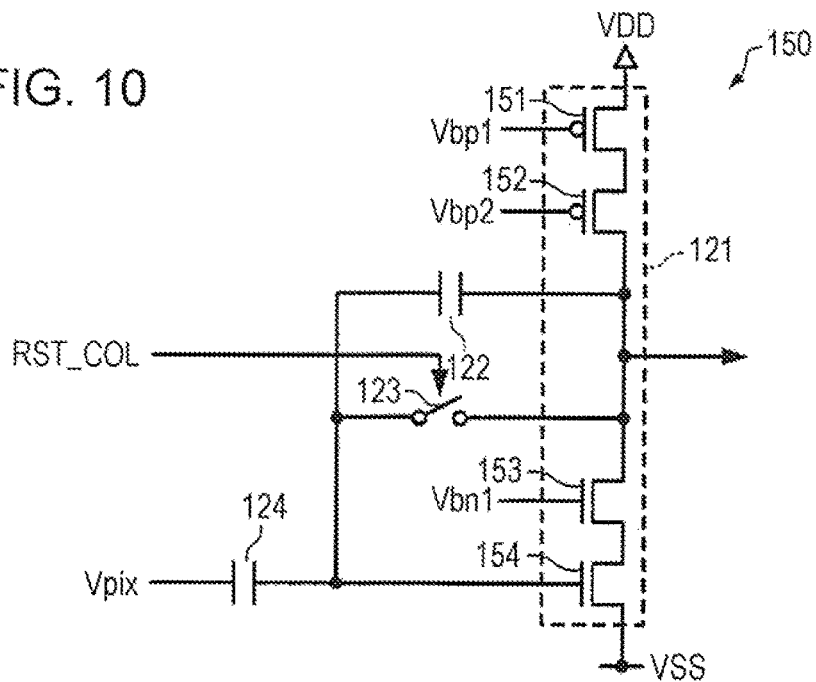
FIG. 10 is a diagram illustrating a specific configuration of a CDS circuit.

Various configurations using a MOS transistor are considered as the operation amplifier 121 provided in the column processing unit 120 (CDS circuit 150). However, in the exemplary embodiment, the operation amplifier 121 has a configuration as illustrated in FIG. 10. FIG. 10 is a diagram illustrating a specific configuration of the CDS circuit 150 including the operation amplifier 121. As illustrated in FIG. 10, the CDS circuit 150 includes an operation amplifier 121, a capacitor 122, a switch 123, and a capacitor 124. The operation amplifier 121 includes a PMOS transistor 151, a PMOS transistor 152, an NMOS transistor 153, and an NMOS transistor 154.

In the NMOS transistor 154, the gate terminal is connected to one end of the capacitor 122, one end of the switch 123, and another end of the capacitor 124. The ground potential VSS is supplied to the source terminal of the NMOS transistor 154, and the drain terminal thereof is connected to the source terminal of the NMOS transistor 153.

A bias voltage Vbn1 is supplied to the gate terminal of the NMOS transistor 153. The source terminal of the NMOS transistor 153 is connected to the drain terminal of the NMOS transistor 154, and the drain terminal thereof is connected to another end of the capacitor 122, another end of the switch 123, and the drain terminal of the PMOS transistor 152.

A bias voltage Vbp1 is supplied to the gate terminal of the PMOS transistor 151. The power source potential VDD is supplied to the source terminal of the PMOS transistor 151. The drain terminal thereof is connected to the source terminal of the PMOS transistor 152.

A bias voltage Vbp2 is supplied to the gate terminal of the PMOS transistor 152. The source terminal of the PMOS transistor 152 is connected to the drain terminal of the PMOS transistor 151, and the drain terminal thereof is connected to another end of the capacitor 122, another end of the switch 123, and the drain terminal of the NMOS transistor 153.

The bias voltages Vbn1, Vbp1, and Vbp2 are generated in a voltage generation unit (not illustrated in FIGS. 6 and 7).

The operation amplifier 121 having such a configuration is a source-grounded type amplifier in which the PMOS transistor 151 and the PMOS transistor 152 are cascode-connected to each other, and the NMOS transistor 154 and the NMOS transistor 153 are cascode-connected to each other. In addition, the operation amplifier 121 has about 100 times gain of a source-grounded type amplifier in which the PMOS transistor 152 and the NMOS transistor 153 are provided. Thus, a signal having much higher accuracy is obtained.

Figure 11:
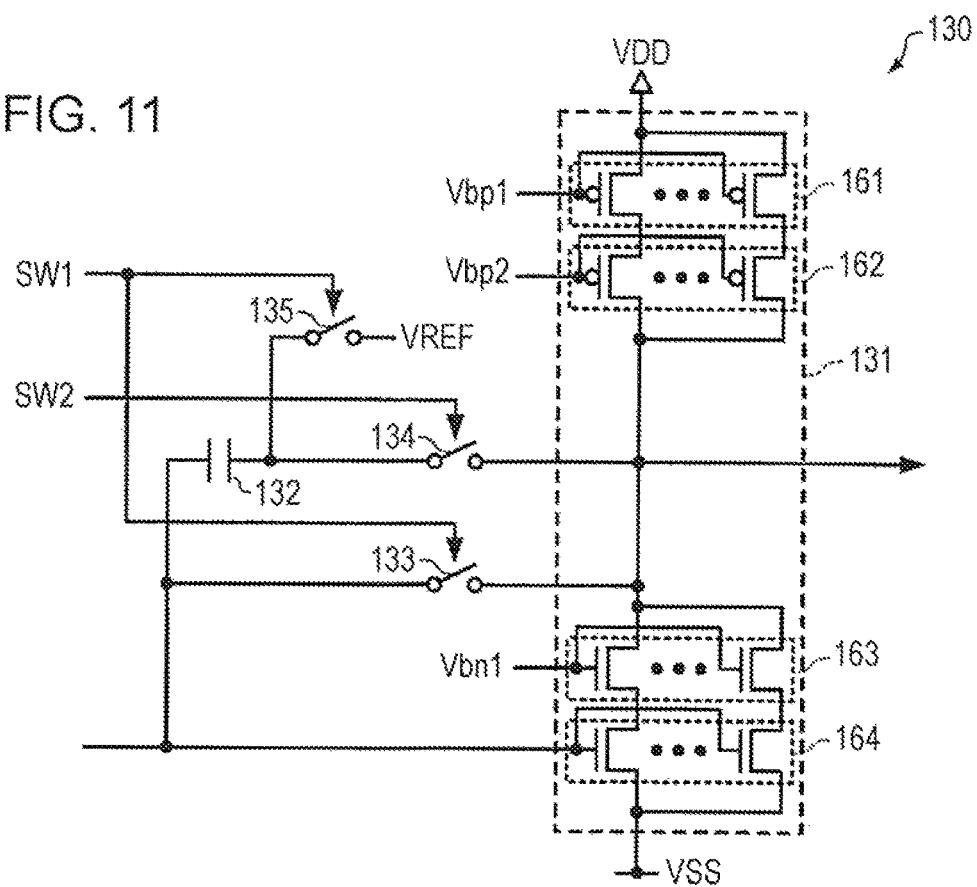
FIG. 11 is a diagram illustrating a specific configuration of an amplification circuit.

Similarly, various configurations using a MOS transistor are considered as the operation amplifier 131 provided in the amplification circuit 130. However, in the exemplary embodiment, the operation amplifier 131 has a configuration as illustrated in FIG. 11. FIG. 11 is a diagram illustrating a specific configuration of the amplification circuit 130 including the operation amplifier 131. As illustrated in FIG. 11, the amplification circuit 130 includes an operation amplifier 131, a capacitor 132, a switch 133, a switch 134, and a switch 135. The operation amplifier 131 includes a PMOS transistor group 161, a PMOS transistor group 162, an NMOS transistor group 163, and an NMOS transistor group 164.

Each NMOS transistor included in the NMOS transistor group 164 has a gate terminal connected to one end of the switch 133 and one end of the capacitor 132. The ground potential VSS is supplied to the source terminal of each NMOS transistor included in the NMOS transistor group 164, and the drain terminal thereof is connected to the source terminal of one of NMOS transistors included in the NMOS transistor group 163.

Each of the NMOS transistors included in the NMOS transistor group 163 has a gate terminal to which the bias voltage Vbn1 is supplied. The source terminal of each of the NMOS transistors included in the NMOS transistor group 163 is connected to the drain terminal of one of NMOS transistors included in the NMOS transistor group 164. The drain terminal of each of the NMOS transistors included in the NMOS transistor group 163 is connected to another end of the switch 133, another end of the switch 134, and drain terminals of all PMOS transistors included in the PMOS transistor group 162.

Each PMOS transistor included in the PMOS transistor group 161 has a gate terminal to which the bias voltage Vbp1 is supplied, and a source terminal to which the power source potential VDD is supplied. The drain terminal of each PMOS transistor included in the PMOS transistor group 161 is connected to the source terminal of one of PMOS transistors included in the PMOS transistor group 162.

Each of the PMOS transistors included in the PMOS transistor group 162 has a gate terminal to which the bias voltage Vbp2 is supplied. The source terminal of each of the PMOS transistors included in the PMOS transistor group 162 is connected to the drain terminal of one of the transistors included in the PMOS transistor group 161. The drain terminal of each of the PMOS transistors included in the PMOS transistor group 162 is connected to another end of the capacitor 122, another end of the switch 123, and drain terminals of all of the NMOS transistors included in the NMOS transistor group 163.

The bias voltages Vbn1, Vbp1, and Vbp2 are generated in a voltage generation unit (not illustrated in FIGS. 6 and 7).

The operation amplifier 131 having such a configuration is a source-grounded type amplifier in which each of the PMOS transistors included in the PMOS transistor group 161 and each of the PMOS transistors included in the PMOS transistor group 162 are cascode-connected to each other, and each of the NMOS transistors included in the NMOS transistor group 164 and each of the NMOS transistor included in the NMOS transistor group 163 are cascode-connected to each other. Thus, the operation amplifier 131 has high current driving capability, and enables a high speed operation. In addition, the operation amplifier 131 has about 100 times gain of a source-grounded type amplifier in which the PMOS transistor group 162 and the NMOS transistor group 163 are not provided. Thus, a signal having much higher accuracy is obtained.

In the above-described image reading chip 415 according to the exemplary embodiment, an ideal calculation expression for the voltage Vcds of the output signal CDSO of the CDS circuit 150 is Expression (1).

$$Vcds = Vt1 + Ci1/Cf1 \cdot \Delta Vpix \quad (1)$$

In Expression (1), Vt1 indicates an offset voltage of the operation amplifier 121, and Vt1 is the sum of a threshold voltage Vth1 and a overdrive voltage Vov1 of a MOS transistor (for example, NMOS transistor 154 in FIG. 10) constituting the operation amplifier 121. Ci1 indicates a capacitance value of the capacitor 124, and Cf1 indicates a capacitance value of the capacitor 122. ΔVpix indicates a difference between the voltage of the pixel signal PIXO when the pixel reset signal RST_PIX is active (high level), and the voltage of the pixel signal PIXO when the transfer signal TX is active (high level) (see FIG. 9).

When the selection signal SEL is active (high level), the voltage of the image signal VDO output from the column processing unit 120 corresponds to Vcds. In a case where the resolution is set to 1200 dpi, an input voltage of the amplification circuit 130 also corresponds to Vcds. Thus, since the operation amplifier 104 is a voltage follower, the voltage Vos of the image signal OS output from the image reading chip 415 coincides with the image signal SO (any of S01 to SO4) output from the amplification circuit 130. Thus, Expression (2) is obtained.

$$Vos = VREF - Cmem/Cf2 \cdot (Vcds - Vt2) \quad (2)$$

In Expression (2), Vt2 indicates an offset voltage of the operation amplifier 131, and Vt2 is the sum of a threshold voltage Vth2 and an overdrive voltage Vov2 of a MOS transistor (for example, each of the NMOS transistors included in the NMOS transistor group 164 in FIG. 11) constituting the operation amplifier 131. Cmem indicates a capacitance value of the capacitor 126, and Cf2 indicates a capacitance value of the capacitor 132.

Here, if Expression (1) is substituted with Expression (2), and the offset voltage Vt1 of the operation amplifier 121 and the offset voltage Vt2 of the operation amplifier 131 are set to be an offset voltage vt which is substantially equal to the offset voltages Vt1 and Vt2, the voltage Vos of the image signal OS is approximate to Expression (3).

$$Vos \approx VREF - Cmem/Cf2 \cdot Ci1/Cf1 \cdot \Delta Vpix \quad (3)$$

Since the term including the offset voltage Vt is not provided in Expression (3), it is possible to widen a dynamic range of the image signal OS. Since ΔVpix is 0 V when illumination is 0, according to Expression (3), the image signal OS has the reference voltage VREF, and ΔVpix is increased with an increase of illumination. Thus, the image signal OS has a lower potential. This is because of the following reason. The image reading chip 415 includes the amplification circuit 130 (example of a third amplification unit) which functions as an inverting amplifier and a pre-amplifier and has characteristics in which an output voltage is lowered with an increase of illumination. Further, the image reading chip 415 includes the operation amplifier 104 (example of a fourth amplification unit) at the subsequent stage. The operation amplifier 104 functions as a non-inverting amplifier and an output amplifier, and thus the operation amplifier 104 performs non-inverting amplification on the output signal of the amplification circuit 130 so as to generate the output signal (image signal OS) of the image reading chip 415.

Figure 12:
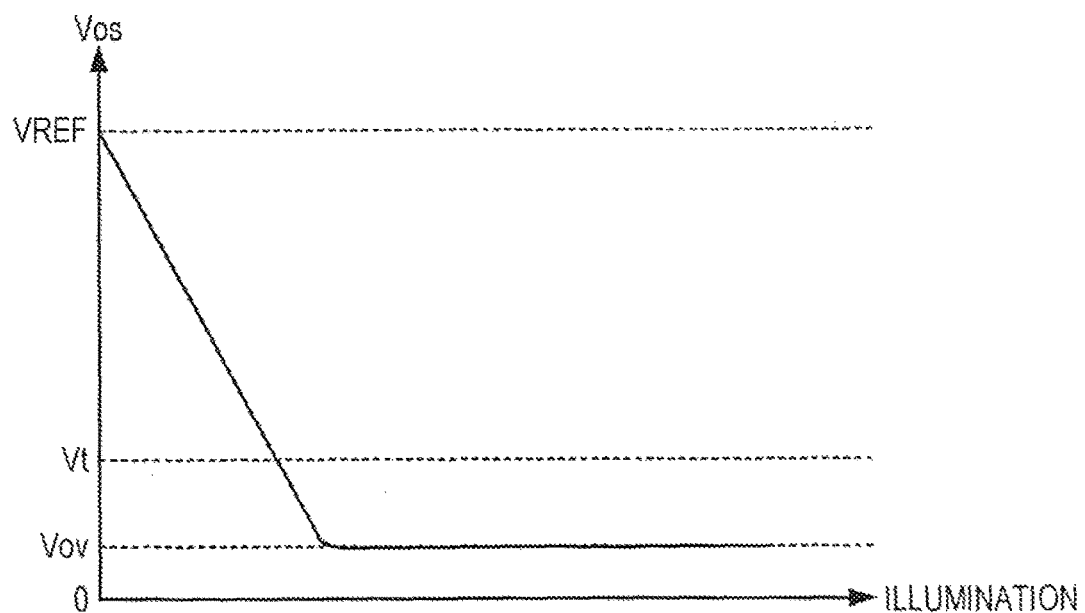
FIG. 12 is a graph illustrating illumination/output voltage characteristics of the image reading chip according to the exemplary embodiment.
Figure 13:
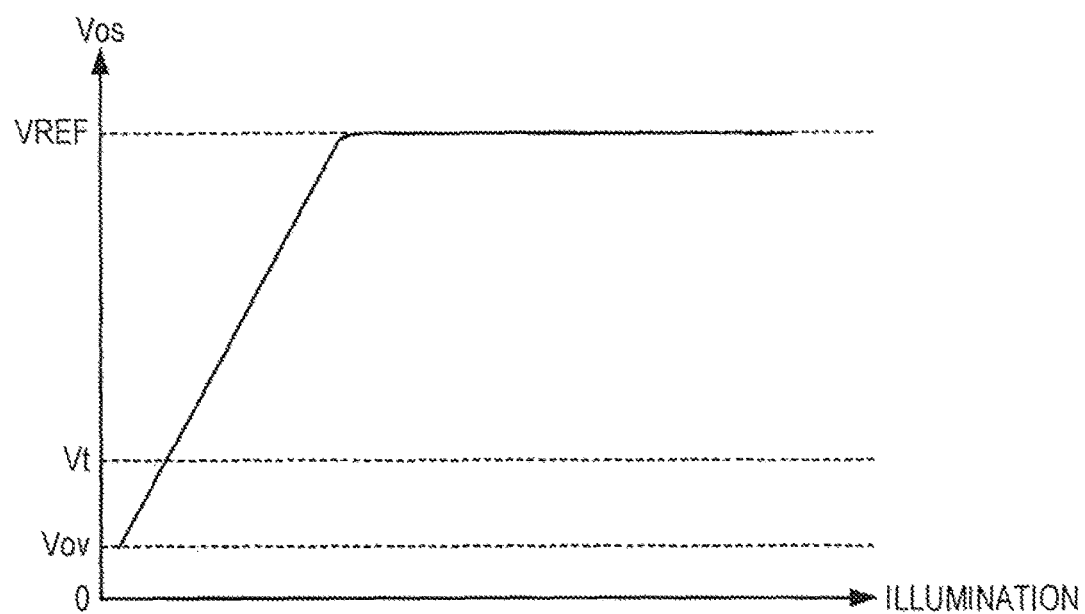
FIG. 13 is a graph illustrating illumination/output voltage characteristics of the image reading chip in the related art.

FIG. 12 is a graph illustrating illumination/output voltage characteristics of the image reading chip 415 according to the exemplary embodiment. FIG. 13 is a graph illustrating illumination/output voltage characteristics of the image reading chip in the related art, as a comparative example. In the image reading chip of the related art, the amplification circuit 130 is not provided. In FIGS. 12 and 13, a horizontal axis indicates illumination, and a vertical axis indicates the voltage Vos of the image signal OS.

As illustrated in FIG. 13, in the image reading chip of the comparative example, the voltage Vos of the image signal OS is the overdrive voltage Vov when being dark (when illumination is 0). As illumination is increased, the voltage Vos is linearly increased up to the reference voltage VREF. Thus, when being dark, the voltage Vos has a low potential depending on the offset voltage Vt, and a difference from a noise level is small. Thus, signal accuracy when being dark is deteriorated.

On the contrary, as illustrated in FIG. 12, in the image reading chip 415 according to the exemplary embodiment, the voltage Vos of the image signal OS is the reference voltage VREF when being dark (when illumination is 0). As illumination is increased, the voltage Vos is linearly increased up to the overdrive voltage Vov (which is higher than 0 V, and is lower than the offset voltage Vt). Thus, the image signal OS has a sufficiently high voltage in comparison to the noise level when being dark, and thus a signal accuracy when being dark is improved.

4. Layout Configuration of Image Reading Chip

As described above, if the offset voltage Vt1 of the operation amplifier 121 is substantially equal to the offset voltage Vt2 of the operation amplifier 131, the voltage Vos of the image signal OS is approximate to Expression (3) in which the term including the offset voltage Vt is not provided. Thus, it is possible to widen the dynamic range of the image signal OS. As a result, the image reading chip 415 can read an image with higher accuracy.

Thus, in the exemplary embodiment, a layout configuration of the image reading chip, particularly, arrangement of the pixel unit 110, the column processing unit 120, and the amplification circuit 130 is devised so as to cause the offset voltage Vt1 of the operation amplifier 121 to be substantially equal to the offset voltage Vt2 of the operation amplifier 131.

Figure 14:
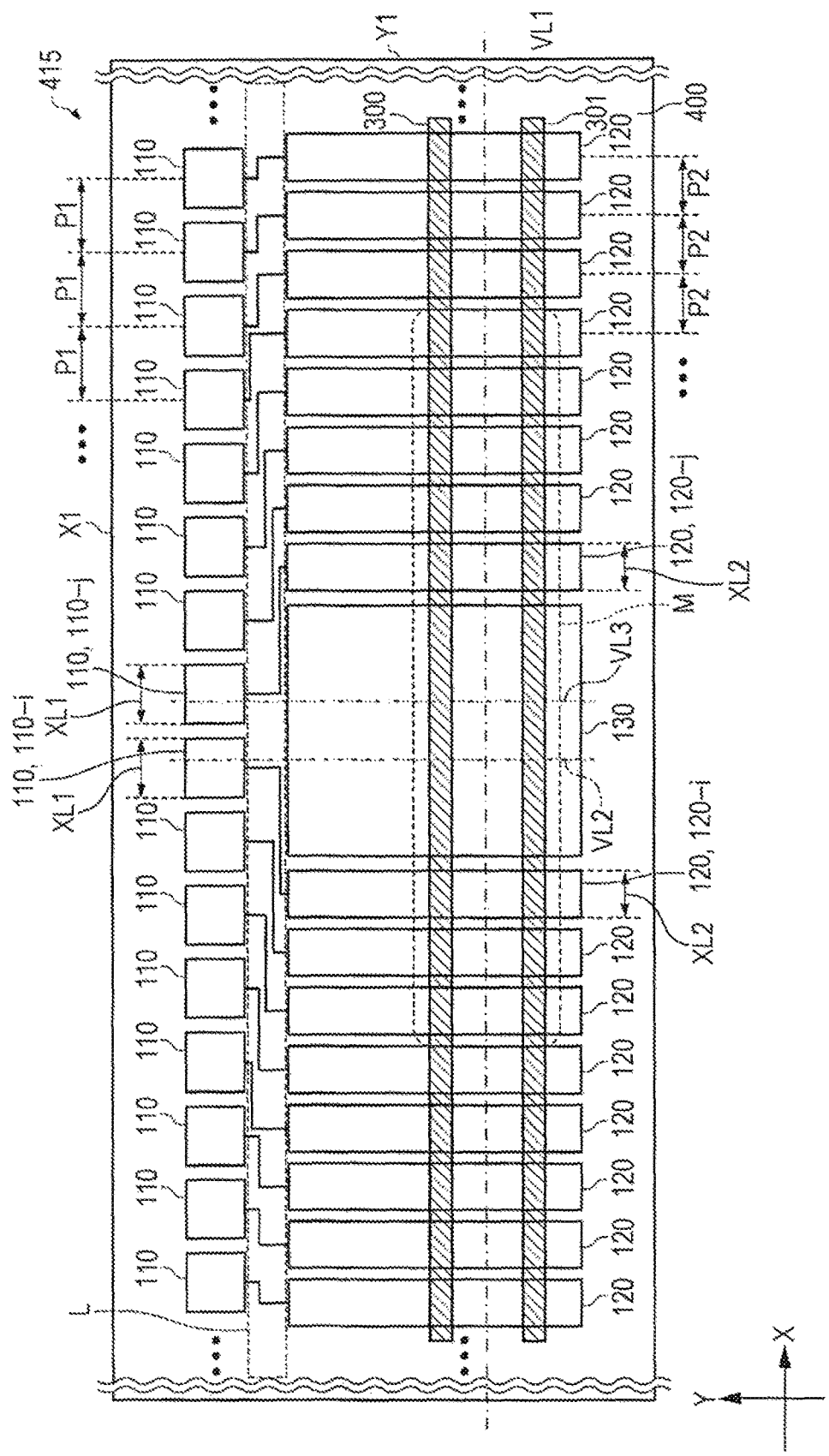
FIG. 14 is a diagram illustrating a layout configuration of the image reading chip according to the exemplary embodiment.

FIG. 14 is a diagram illustrating the layout configuration of the image reading chip 415. FIG. 14 illustrates only a portion of one signal processing unit 103 (see FIG. 6) when a semiconductor substrate 400 of the image reading chip 415 is viewed in plan.

As illustrated in FIG. 14, the image reading chip 415 has a shape including a first side X1 and a second side Y1 shorter than the first side X1. For example, in the image reading chip 415, the first side X1 has the same length as that of a side which faces the first side X1, the second side Y1 has the same length as a side which faces the second side Y1, and the first side X1 is perpendicular to the second side Y1. That is, the image reading chip 415 may have a rectangular shape.

In the exemplary embodiment, an image sensor module 41 is a line sensor. Thus, as illustrated in FIG. 14, in the image reading chip 415, a plurality of pixel units 110 is arranged in a line at the constant pitch (first pitch P1) in the direction (below referred to as "X axis direction") along the first side X1. The first pitch P1 is determined in accordance with the maximum value (1200 dpi in the exemplary embodiment) of the resolution for reading an image.

A plurality of column processing units 120 is arranged in a line at the constant pitch (second pitch P2) in the X axis direction. The plurality of column processing units 120 is arranged in a region obtained by separating a wiring region L from an arrangement region of the plurality of pixel units 110 in a direction (below referred to as "Y axis direction") along the second side Y1. The wiring region L is a region in which a plurality of wirings for connecting the plurality of pixel units 110 and the plurality of column processing units 120 is provided.

In the exemplary embodiment, the amplification circuit 130 is disposed at a portion of the arrangement of the column processing units 120. Specifically, as illustrated in FIG. 14, the amplification circuit 130 (example of the third amplification unit) is disposed between a column processing unit 120-$i$ (example of a first amplification unit) and a column processing unit 120-$j$ (example of a second amplification unit) among the plurality of column processing units 120 in the X axis direction. In other words, when the semiconductor substrate 400 of the image reading chip 415 is viewed in plan, a virtual line VL1 which overlaps at least a portion of the column processing unit 120-$i$, at least a portion of the column processing unit 120-$j$, and at least a portion of the amplification circuit 130, and is parallel to the first side X1 is provided.

Here, the column processing unit 120-$i$ is electrically connected to a pixel unit 110-$i$ (example of a first pixel unit) among the plurality of pixel units 110. The column processing unit 120-$i$ amplifies a pixel signal PIXO-i (example of a first pixel signal) output by the pixel unit 110-$i$, and outputs an image signal VDO-i (example of a first amplification signal) (see FIG. 8). Similarly, the column processing unit 120-$j$ is electrically connected to a pixel unit 110-$j$ (example of a second pixel unit) among the plurality of pixel units 110. The column processing unit 120-$j$ amplifies a pixel signal PIXO-j (example of a second pixel signal) output by the pixel unit 110-$j$, and outputs an image signal VDO-j (example of a second amplification signal) (see FIG. 8). The pixel unit 110-$i$ includes a light receiving element 111 (example of a first light receiving element) which receives light so as to perform photoelectric conversion. The pixel unit 110-$i$ generates a pixel signal PIXO-i (see FIG. 8). Similarly, the pixel unit 110-$j$ among the plurality of pixel units 110 includes a light receiving element 111 (example of a second light receiving element) which receives light so as to perform photoelectric conversion. The pixel unit 110-$j$ generates a pixel signal PIXO-j (see FIG. 8). The amplification circuit 130 amplifies each of a plurality of image signals VDO, which includes the image signal VDO-i and the image signal VDO-j, and is output from each of the plurality of column processing units 120. The amplification circuit 130 outputs an amplified signal.

As illustrated in FIG. 14, in the exemplary embodiment, the column processing unit 120-$i$ and the amplification circuit 130 are disposed so as to be adjacent to each other. However, the column processing unit 120-$i$ and the amplification circuit 130 may not be disposed so as to be adjacent to each other. Similarly, in the exemplary embodiment, the column processing unit 120-$j$ and the amplification circuit 130 are disposed so as to be adjacent to each other. However, the column processing unit 120-$j$ and the amplification circuit 130 may not be disposed so as to be adjacent to each other.

In the exemplary embodiment, the length XL2 of the column processing unit 120 in the X axis direction is set to be shorter than the length XL1 of the pixel unit 110 in the X axis direction, and thus the second pitch P2 is narrower than the first pitch P1. As illustrated in FIG. 14, in the X axis direction, the sum (=XL1×2) of the length XL1 of the pixel unit 110-$i$ and the length XL1 of the pixel unit 110-$j$ is larger than the sum (=XL2×2) of the length XL2 of the column processing unit 120-$i$ and the length XL2 of the column processing unit 120-$j$. Further, as illustrated in FIG. 14, the amplification circuit 130 is provided at a position which overlaps at least one of the pixel unit 110-$i$ and the pixel unit 110-$j$ in the Y axis direction. In other words, when the semiconductor substrate 400 of the image reading chip 415 is viewed in plan, at least one of a virtual straight line VL2 and a virtual straight line VL3 is provided. The virtual straight line VL2 overlaps at least a portion of the amplification circuit 130 and at least a portion of the pixel unit 110-*i*, and is parallel to the second side Y1. The virtual straight line VL3 overlaps at least a portion of the amplification circuit 130 and at least a portion of the pixel unit 110-*j*, and is parallel to the second side Y1.

n pieces of the pixel units 110 and n pieces of the column processing units 120 are arranged as described above, and thus a space is provided between a column processing unit 120-*i* and a column processing unit 120-*j*, and the amplification circuit 130 can be disposed in the space. Accordingly, reduction of the chip size of the image reading chip 415 is realized.

Figure 15:
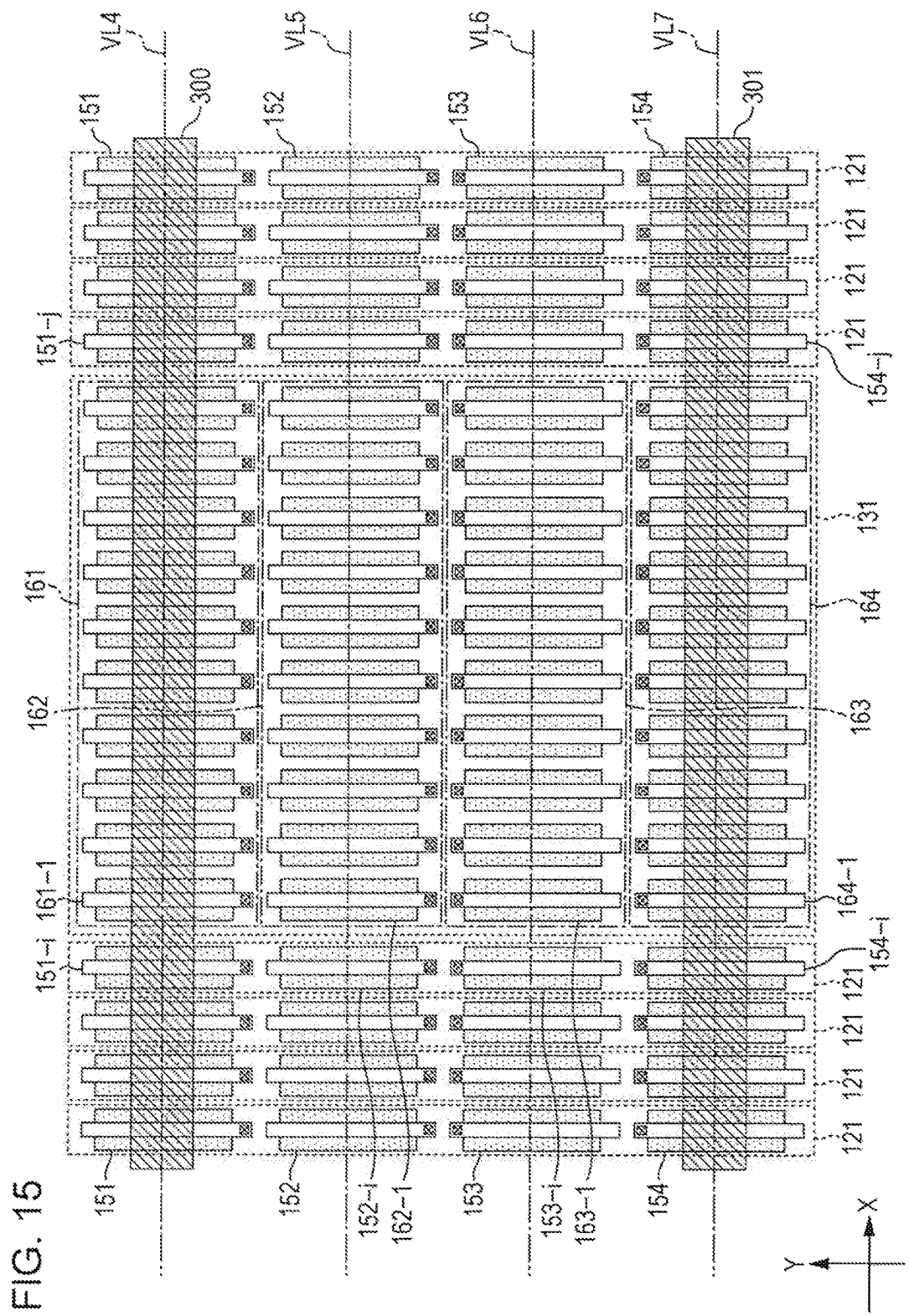
FIG. 15 is an enlarged view illustrating a region M in FIG. 14.

In the exemplary embodiment, arrangement of the plurality of MOS transistors included in the operation amplifier 121 and the plurality of MOS transistors included in the operation amplifier 131 is also devised. FIG. 15 is an enlarged view of a region M in FIG. 14. FIG. 15 illustrates arrangement of the plurality of MOS transistors included in the operation amplifier 121 and the plurality of MOS transistors included in the operation amplifier 131.

In the exemplary embodiment, each of a plurality of operation amplifiers 121 includes a PMOS transistor 151, a PMOS transistor 152, an NMOS transistor 153, and an NMOS transistor 154 (see FIG. 10). The operation amplifier 131 includes a PMOS transistor group 161, a PMOS transistor group 162, an NMOS transistor group 163, and an NMOS transistor group 164 (see FIG. 11). As illustrated in FIG. 15, a plurality of PMOS transistors 151 and a plurality of PMOS transistors constituting the PMOS transistor group 161 have the same size (gate width and gate length) and are arranged in line in the X axis direction. Similarly, a plurality of PMOS transistors 152 and a plurality of PMOS transistors constituting the PMOS transistor group 162 have the same size (gate width and gate length) and are arranged in line in the X axis direction. Similarly, a plurality of NMOS transistors 153 and a plurality of NMOS transistors constituting the NMOS transistor group 163 have the same size (gate width and gate length) and are arranged in line in the X axis direction. Similarly, a plurality of NMOS transistors 154 and a plurality of NMOS transistors constituting the NMOS transistor group 164 have the same size (gate width and gate length) and are arranged in line in the X axis direction.

Thus, focusing on a PMOS transistor 151-*i* (example of a first transistor) provided in the operation amplifier 121-*i* (example of a first source-grounded type amplifier) of the column processing unit 120-*i*, a PMOS transistor 151-*j* (example of a second transistor) provided in the operation amplifier 121-*j* (example of a second source-grounded type amplifier) of the column processing unit 120-*j*, and one PMOS transistor 161-1 (example of a third transistor) of the PMOS transistor group 161 provided in the operation amplifier 131 (example of a third source-grounded type amplifier), the PMOS transistor 151-*i*, the PMOS transistor 151-*j*, and the PMOS transistor 161-1 are respectively provided at positions which overlap each other in the X axis direction. In other words, a virtual straight line VL4 which overlaps at least a portion of the PMOS transistor 151-*i*, at least a portion of the PMOS transistor 151-*j*, and at least a portion of the PMOS transistor 161-1, and is parallel to the first side X1 of the image reading chip 415 is provided.

Similarly, focusing on a PMOS transistor 152-*i* (example of the first transistor) provided in the operation amplifier 121-*i*, a PMOS transistor 152-*j* (example of the second transistor) provided in the operation amplifier 121-*j*, and one PMOS transistor 162-1 (example of the third transistor) of the PMOS transistor group 162, the PMOS transistor 152-*i*, the PMOS transistor 152-*j*, and the PMOS transistor 162-1 are respectively provided at positions which overlap each other in the X axis direction. In other words, a virtual straight line VL5 which overlaps at least a portion of the PMOS transistor 152-*i*, at least a portion of the PMOS transistor 152-*j*, and at least a portion of the PMOS transistor 162-1, and is parallel to the first side X1 of the image reading chip 415 is provided.

Similarly, focusing on an NMOS transistor 153-*i* (example of the first transistor) provided in the operation amplifier 121-*i*, an NMOS transistor 153-*j* (example of the second transistor) provided in the operation amplifier 121-*j*, and one NMOS transistor 163-1 (example of the third transistor) of the NMOS transistor group 163, the NMOS transistor 153-*i*, the NMOS transistor 153-*j*, and the NMOS transistor 163-1 are respectively provided at positions which overlap each other in the X axis direction. In other words, a virtual straight line VL6 which overlaps at least a portion of the NMOS transistor 153-*i*, at least a portion of the NMOS transistor 153-*j*, and at least a portion of the NMOS transistor 163-1, and is parallel to the first side X1 of the image reading chip 415 is provided.

Similarly, focusing on an NMOS transistor 154-*i* (example of the first transistor) provided in the operation amplifier 121-*i*, an NMOS transistor 154-*j* (example of the second transistor) provided in the operation amplifier 121-*j*, and one NMOS transistor 164-1 (example of the third transistor) of the NMOS transistor group 164, the NMOS transistor 154-*i*, the NMOS transistor 154-*j*, and the NMOS transistor 164-1 are respectively provided at positions which overlap each other in the X axis direction. In other words, a virtual straight line VL7 which overlaps at least a portion of the NMOS transistor 154-*i*, at least a portion of the NMOS transistor 154-*j*, and at least a portion of the NMOS transistor 164-1, and is parallel to the first side X1 of the image reading chip 415 is provided.

The plurality of MOS transistors included in the operation amplifier 121, and the plurality of MOS transistors included in the operation amplifier 131 are arranged as described above, and thus manufacturing variation of the plurality of MOS transistors is reduced. Thus, the threshold voltage Vth1 of each of a plurality of NMOS transistors 154 is substantially equal to the threshold voltage Vth2 of each of a plurality of NMOS transistors constituting the NMOS transistor group 164. Here, "being substantially equal" includes a case where the threshold voltage Vth1 and the threshold voltage Vth2 are slightly shifted from a designed value due to accuracy, variation, and the like of processing in manufacturing, and thus a small difference between the threshold voltages Vth1 and Vth2 may occur, in addition to a case where the threshold voltages Vth1 and Vth2 accurately coincide with each other. The overdrive voltage Vov1 of each of the plurality of NMOS transistors 154 is substantially equal to the overdrive voltage Vov2 of each of the plurality of NMOS transistors constituting the NMOS transistor group 164. Here, "being substantially equal" includes a case where the overdrive voltage Vov1 and the overdrive voltage Vov2 are slightly shifted from a designed value due to accuracy, variation, and the like of processing in manufacturing, and thus a small difference between the overdrive voltages Vov1 and Vov2 may occur, in addition to a case where the overdrive voltages Vov1 and Vov2 accurately coincide with each other.

Further, as illustrated in FIG. 14, in the exemplary embodiment, a power source wiring 300 on which the power source potential VDD is supplied, and a ground wiring 301 on which the ground potential VSS is supplied are drawn in a straight line in the X axis direction. When the semiconductor substrate 400 of the image reading chip 415 is viewed in plan, the power source wiring 300 and the ground wiring 301 overlap the plurality of column processing units 120 and the amplification circuit 130. The plurality of column processing units 120 and the amplification circuit 130 are electrically connected to the common power source wiring 300 and the common ground wiring 301. More detailed, as illustrated in FIG. 15, when the semiconductor substrate 400 of the image reading chip 415 is viewed in plan, the power source wiring 300 overlaps the plurality of PMOS transistors 151 and the plurality of PMOS transistors constituting the PMOS transistor group 161. These PMOS transistors are electrically connected to the common power source wiring 300. Similarly, when the semiconductor substrate 400 of the image reading chip 415 is viewed in plan, the ground wiring 301 overlaps the plurality of NMOS transistors 154 and the plurality of NMOS transistors constituting the NMOS transistor group 164. These NMOS transistors are electrically connected to the common ground wiring 301.

Thus, the power source potential VDD from the common power source wiring 300 and the ground potential VSS from the common ground wiring 301 are supplied to the operation amplifier 121 in each of n pieces of the column processing units 120, and the operation amplifier 131 in the amplification circuit 130, and thus it is possible to accurately adjust the power source potential and the ground potential between n pieces of the operation amplifiers 121 and the operation amplifier 131.

With such a layout configuration of the image reading chip 415, the offset voltage Vt1 of the operation amplifier 121 is substantially equal to the offset voltage Vt2 of the operation amplifier 131. Thus, conditions for establishing the above-described approximate Expression (3) are satisfied, and thus it is possible to significantly reduce the component of the offset voltage included in the voltage Vos of the image signal OS. As a result, it is possible to widen the dynamic range of an image signal OS output from the image reading chip 415, and to read an image with high accuracy.

5. Advantages

As described above, in a scanner unit (image reading apparatus) 3 according to the exemplary embodiment, as illustrated in FIG. 15, in the amplification circuit 130, a plurality of MOS transistors included in n pieces of the column processing units 120 and a plurality of MOS transistors included in the amplification circuit 130 are arranged in line in the direction along the first side X1 of the image reading chip 415. Thus, it is possible to cause manufacturing errors in the plurality of transistors to be substantially equal to each other. Thus, the threshold voltages of the plurality of MOS transistors are substantially equal to each other, or the overdrive voltages thereof are substantially equal to each other. The offset voltage Vt1 of each of n pieces of the operation amplifiers 121 is substantially equal to the offset voltage Vt2 of the operation amplifier 131.

In the scanner unit (image reading apparatus) 3 according to the exemplary embodiment, the power source potential VDD from the common power source wiring 300, and the ground potential VSS from the ground wiring 301 are supplied to n pieces of the column processing units 120 and the amplification circuit 130. Thus, it is possible to accurately adjust the power source potential and the ground potential between n pieces of the column processing units 120 and the amplification circuit 130. Thus, it is possible to set the offset voltage Vt1 of the operation amplifier 121 to be substantially equal to the offset voltage Vt2 of the operation amplifier 131, and to significantly reduce the component of the offset voltage included in the voltage Vos of an image signal OS.

In the scanner unit (image reading apparatus) 3 according to the exemplary embodiment, as illustrated in FIG. 6, output signals of 4n pieces of column processing units 120 are not directly input to the operation amplifier 104, but four image signals SO1, S02, S03, and S04 output from four amplification circuits 130 are input to the operation amplifier 104. Thus, input capacitance of the operation amplifier 104 is reduced. Thus, it is possible to reduce the deteriorated degree of an image signal OS output by the image reading chip 415.

Furthermore, in the scanner unit (image reading apparatus) 3 according to the exemplary embodiment, as illustrated in FIGS. 10 and 11, n pieces of operation amplifiers 121 and the operation amplifier 131 are source-grounded type amplifiers in which a plurality of MOS transistors is cascode-connected. Thus, about 100 times gain of a source-grounded type amplifier in which cascode-connection is not performed is obtained, and thus a S/N ratio of an image signal OS output by the image reading chip 415 is improved.

As a result, according to the scanner unit (image reading apparatus) 3 according to the exemplary embodiment, it is possible to widen the dynamic range of an image signal OS output from the image reading chip 415, and thus it is possible to read an image with high accuracy.

According to the scanner unit (image reading apparatus) 3 according to the exemplary embodiment, as illustrated in FIG. 12, the voltage Vos of an image signal OS is the reference voltage VREF which is sufficiently high in comparison to a noise level, during being dark (when illumination is 0). Accordingly, it is possible to improve signal accuracy during being dark, and to read an image with high accuracy.

In the scanner unit (image reading apparatus) 3 according to the exemplary embodiment, as illustrated in FIG. 14, the second pitch P2 for n pieces of the column processing units 120 is set to be shorter than the first pitch P1 for n pieces of the pixel units 110, and thus the amplification circuit 130 is disposed in a space between n pieces of the column processing units 120. Accordingly, it is possible to reduce an unnecessary space, and to reduce a chip size of the image reading chip 415.

6. Modification Example

Figure 16:
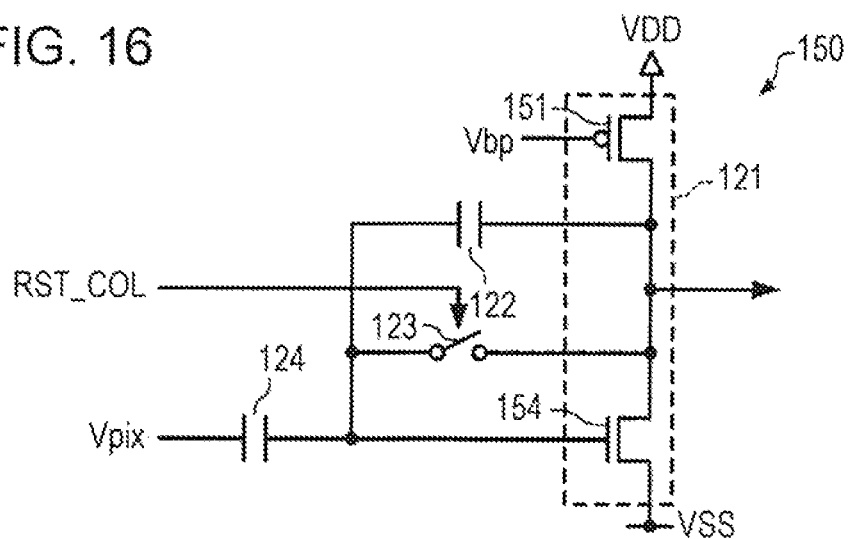
FIG. 16 is a diagram illustrating a specific configuration of a CDS circuit in a modification example.

In the above exemplary embodiment, the operation amplifier 121 of the CDS circuit 150 is a source-grounded type amplifier in which a plurality of MOS transistors is cascode-connected (see FIG. 10). However, the operation amplifier 121 may be a source-grounded type amplifier in which MOS transistors are not cascode-connected. That is, as illustrated in FIG. 16, the operation amplifier 121 may be configured by the PMOS transistor 151 and the NMOS transistor 154. In the NMOS transistor 154, the gate terminal is connected to one end of the capacitor 122, one end of the switch 123, and another end of the capacitor 124. The ground potential VSS is supplied to the source terminal of the NMOS transistor 154, and the drain terminal thereof is connected to the drain terminal of the PMOS transistor 151. A bias voltage Vbp is supplied to the gate terminal of the PMOS transistor 151. The power source potential VDD is supplied to the source terminal of the PMOS transistor 151. The drain terminal thereof is connected to the source terminal of the NMOS transistor 154.

Figure 17:
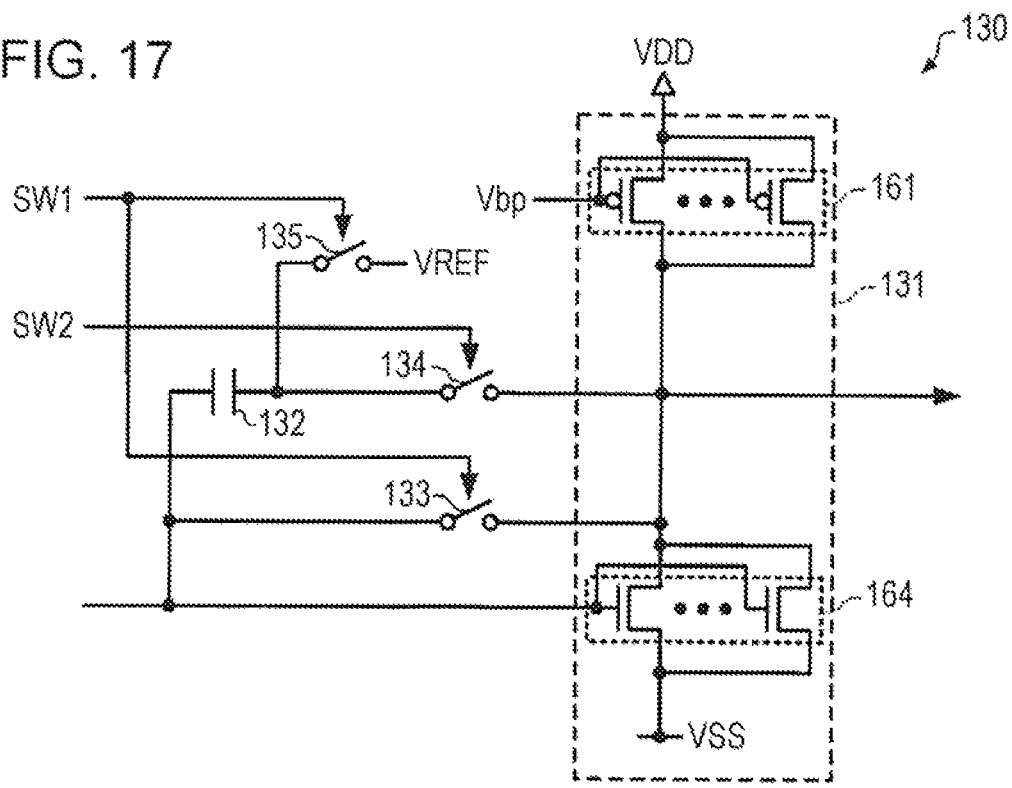
FIG. 17 is a diagram illustrating a specific configuration of an amplification circuit in the modification example.

Similarly, the operation amplifier 131 of the amplification circuit 130 is a source-grounded type amplifier in which a plurality of MOS transistors is cascode-connected (see FIG. 11). However, the operation amplifier 131 may be a source-grounded type amplifier in which MOS transistors are not cascode-connected. That is, as illustrated in FIG. 17, the operation amplifier 131 may be configured by the PMOS transistor group 161 and the NMOS transistor group 164. Each NMOS transistor included in the NMOS transistor group 164 has a gate terminal connected to one end of the switch 133 and one end of the capacitor 132. The ground potential VSS is supplied to the source terminal of each NMOS transistor included in the NMOS transistor group 164, and the drain terminal thereof is connected to the drain terminal of one of PMOS transistors included in the PMOS transistor group 161. Each PMOS transistor included in the PMOS transistor group 161 has a gate terminal to which the bias voltage Vbp is supplied, and a source terminal to which the power source potential VDD is supplied. The drain terminal of each PMOS transistor included in the PMOS transistor group 161 is connected to the drain terminal of one of NMOS transistors included in the NMOS transistor group 164.

Figure 18:
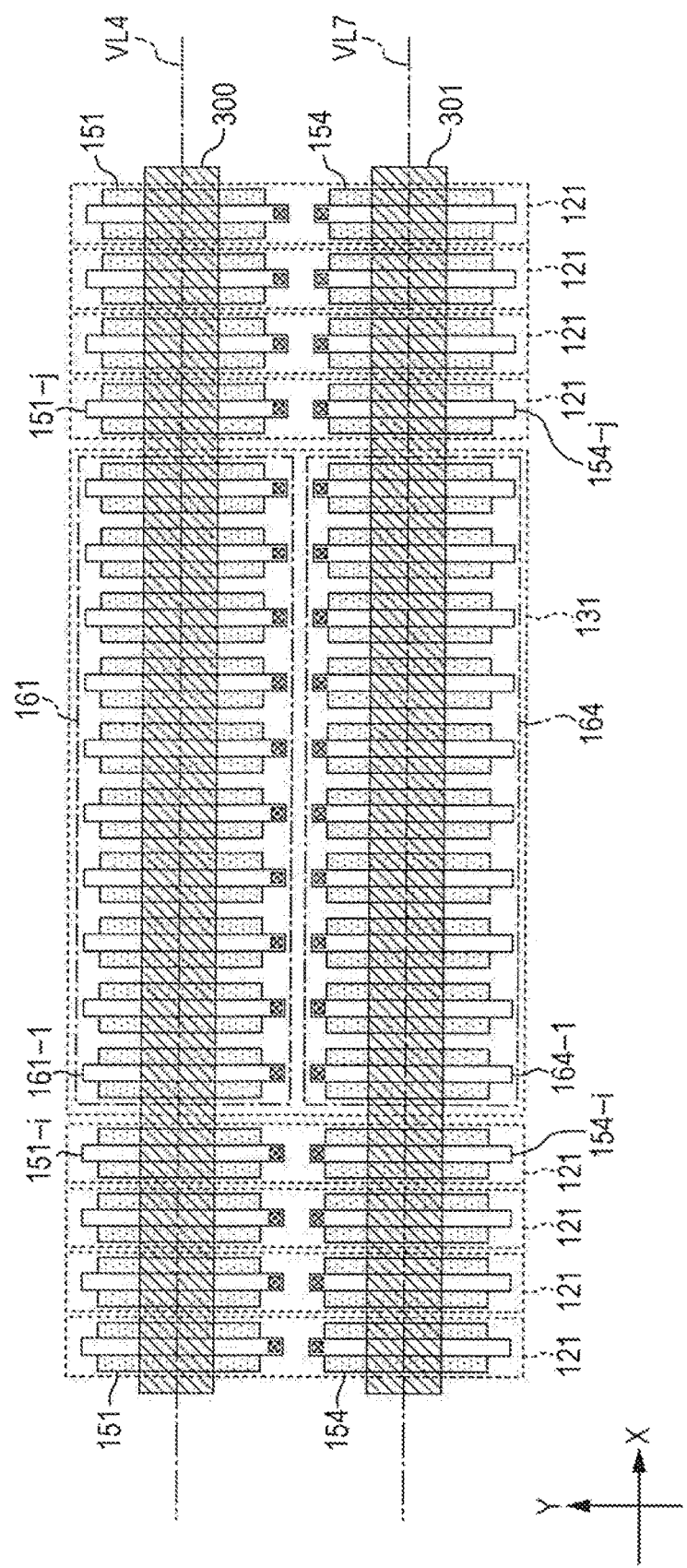
FIG. 18 is a diagram illustrating a layout configuration of the image reading chip in the modification example.

FIG. 18 is a diagram illustrating an arrangement example in which a plurality of MOS transistors included in a plurality of operation amplifier 121 having a configuration as illustrated in FIG. 16, and a plurality of MOS transistors included in the operation amplifier 131 having a configuration as illustrated in FIG. 17. Similarly to FIG. 15, FIG. 18 corresponds to an enlarged view of the region M in FIG. 14.

As illustrated in FIG. 18, the plurality of PMOS transistors 151 and the plurality of PMOS transistors constituting the PMOS transistor group 161 have the same size (gate width and gate length) and are arranged in line in the X axis direction. Similarly, a plurality of NMOS transistors 154 and a plurality of NMOS transistors constituting the NMOS transistor group 164 have the same size (gate width and gate length) and are arranged in line in the X axis direction.

Thus, a PMOS transistor 151-$i$ (example of the first transistor), a PMOS transistor 151-$j$ (example of the second transistor), and one PMOS transistor 161-1 (example of the third transistor) of the PMOS transistor group 161 are respectively provided at positions which overlap each other in the X axis direction. In other words, a virtual straight line VL4 which overlaps at least a portion of the PMOS transistor 151-$i$, at least a portion of the PMOS transistor 151-$j$, and at least a portion of the PMOS transistor 161-1, and is parallel to the first side X1 of the image reading chip 415 is provided.

Similarly, an NMOS transistor 154-$i$ (example of the first transistor), an NMOS transistor 154-$j$ (example of the second transistor), and one NMOS transistor 164-1 (example of the third transistor) of the NMOS transistor group 164 are respectively provided at positions which overlap each other in the X axis direction. In other words, a virtual straight line VL7 which overlaps at least a portion of the NMOS transistor 154-$i$, at least a portion of the NMOS transistor 154-$j$, and at least a portion of the NMOS transistor 164-1, and is parallel to the first side X1 of the image reading chip 415 is provided.

As illustrated in FIG. 18, when the semiconductor substrate 400 of the image reading chip 415 is viewed in plan, the power source wiring 300 overlaps the plurality of PMOS transistors 151 and the plurality of PMOS transistors constituting the PMOS transistor group 161. The plurality of PMOS transistors 151 and the plurality of PMOS transistors constituting the PMOS transistor group 161 are electrically connected to the common power source wiring 300. When the semiconductor substrate 400 of the image reading chip 415 is viewed in plan, the ground wiring 301 overlaps the plurality of NMOS transistors 154 and the plurality of NMOS transistors constituting the NMOS transistor group 164. The plurality of NMOS transistors 154 and the plurality of NMOS transistors constituting the NMOS transistor group 164 are electrically connected to the common ground wiring 301.

According to the scanner unit (image reading apparatus) 3 of the modification example, which has such a configuration, similarly to the above exemplary embodiment, it is possible to widen the dynamic range of an image signal OS output from the image reading chip 415. Accordingly, it is possible to read an image with high accuracy, and to reduce the chip size of the image reading chip 415.

Hitherto, the exemplary embodiment or the modification examples are described. However, the invention is not limited to the exemplary embodiment or the modification examples, and may be implemented in various forms in the scope without departing from the gist of the invention. For example, the exemplary embodiment and the modification examples may be appropriately combined.

The invention includes substantially the same configuration (for example, configuration having the same function, the same method, and the same result, or configuration having the same purpose and the same effect) as the configuration described in the exemplary embodiment. The invention includes a configuration obtained by substituting portions which are not essential in the configuration described in the exemplary embodiment. The invention includes a configuration which can have the same advantage as that of the configuration described in the exemplary embodiment, and may achieve the same purpose as that of the configuration. The invention includes a configuration obtained by adding a known technology to the configuration described in the exemplary embodiment.

What is claimed is:

1. An image reading apparatus comprising:
an image reading chip that reads an image,
wherein
the image reading chip includes
a first pixel unit that includes a first light receiving element configured to receive light from the image and perform photoelectric conversion, and generates a first pixel signal,
a second pixel unit that includes a second light receiving element configured to receive light from the image and perform photoelectric conversion, and generates a second pixel signal,
a first amplification unit that is electrically connected to the first pixel unit, amplifies the first pixel signal, and outputs a first amplification signal,
a second amplification unit that is electrically connected to the second pixel unit, amplifies the second pixel signal, and outputs a second amplification signal, and
a third amplification unit that amplifies each of the first amplification signal and the second amplification signal, and outputs an amplified signal,
the image reading chip has a shape which includes a first side and a second side shorter than the first side, and
the third amplification unit is disposed between the first amplification unit and the second amplification unit in a direction along the first side.

2. The image reading apparatus according to claim 1, wherein
the third amplification unit is provided at a position of overlapping at least one of the first pixel unit and the second pixel unit in a direction along the second side.

3. The image reading apparatus according to claim 1, wherein
the sum of a length of the first pixel unit and a length of the second pixel unit in the direction along the first side is larger than the sum of a length of the first amplification unit and a length of the second amplification unit.

4. The image reading apparatus according to claim 1, wherein
the first amplification unit, the second amplification unit, and the third amplification unit are electrically connected to a common ground wiring.

5. The image reading apparatus according to claim 1, wherein
the first amplification unit and the third amplification unit are disposed so as to be adjacent to each other, and
the second amplification unit and the third amplification unit are disposed so as to be adjacent to each other.

6. The image reading apparatus according to claim 1, wherein
the first amplification unit includes a first transistor
the second amplification unit includes a second transistor,
the third amplification unit includes a third transistor, and
the first transistor, the second transistor, and the third transistor are provided at positions which overlap each other in the direction along the first side.

7. The image reading apparatus according to claim 6, wherein
a threshold voltage of the first transistor, a threshold voltage of the second transistor, and a threshold voltage of the third transistor are substantially equal to each other.

8. The image reading apparatus according to claim 6, wherein
an overdrive voltage of the first transistor, an overdrive voltage of the second transistor, and an overdrive voltage of the third transistor are substantially equal to each other.

9. The image reading apparatus according to claim 6, wherein
the first amplification unit includes a first source-grounded type amplifier in which a plurality of transistors including the first transistor is cascode-connected to each other,
the second amplification unit includes a second source-grounded type amplifier in which a plurality of transistors including the second transistor is cascode-connected to each other, and
the third amplification unit includes a third source-grounded type amplifier in which a plurality of transistors including the third transistor is cascode-connected to each other.

10. The image reading apparatus according to claim 1, wherein
the third amplification unit has characteristics in which an output voltage is lowered as illumination is increased.

11. The image reading apparatus according to claim 1, further comprising:
a fourth amplification unit that performs non-inverting amplification on an output signal from the third amplification unit, so as to generate an output signal of the image reading chip.

12. A semiconductor device which has a shape including a first side and a second side shorter than the first side, the device comprising:
a first pixel unit that includes a first light receiving element configured to receive light and perform photoelectric conversion, and generates a first pixel signal;
a second pixel unit that includes a second light receiving element configured to receive light and perform photoelectric conversion, and generates a second pixel signal;
a first amplification unit that is electrically connected to the first pixel unit, amplifies the first pixel signal, and outputs a first amplification signal;
a second amplification unit that is electrically connected to the second pixel unit, amplifies the second pixel signal, and outputs a second amplification signal; and
a third amplification unit that amplifies each of the first amplification signal and the second amplification signal, and outputs an amplified signal,
wherein
the third amplification unit is disposed between the first amplification unit and the second amplification unit in a direction along the first side.

* * * * *